(12) United States Patent
Tsai et al.

(10) Patent No.: US 12,300,592 B2
(45) Date of Patent: May 13, 2025

(54) FAN-OUT PACKAGE WITH CONTROLLABLE STANDOFF

(71) Applicant: Taiwan Semiconductor Manufacturing Co., Ltd., Hsinchu (TW)

(72) Inventors: Po-Hao Tsai, Taoyuan (TW); Techi Wong, Zhubei (TW); Meng-Wei Chou, Zhubei (TW); Meng-Liang Lin, Hsinchu (TW); Po-Yao Chuang, Hsinchu (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/351,809

(22) Filed: Jul. 13, 2023

(65) Prior Publication Data

US 2023/0361015 A1 Nov. 9, 2023

Related U.S. Application Data

(60) Continuation of application No. 17/383,953, filed on Jul. 23, 2021, now Pat. No. 11,854,955, which is a
(Continued)

(51) Int. Cl.
*H01L 23/48* (2006.01)
*H01L 21/48* (2006.01)
(Continued)

(52) U.S. Cl.
CPC ...... *H01L 23/49827* (2013.01); *H01L 21/486* (2013.01); *H01L 24/09* (2013.01);
(Continued)

(58) Field of Classification Search
CPC .. H01L 23/49827; H01L 21/486; H01L 24/09
(Continued)

(56) References Cited

U.S. PATENT DOCUMENTS 7,838,334 B2 11/2010 Yu et al.
8,217,502 B2 * 7/2012 Ko .................. H01L 23/49833
257/773
(Continued)

FOREIGN PATENT DOCUMENTS

CN 104253105 A 12/2014
CN 106206529 A 12/2016
(Continued)

*Primary Examiner* — Nitin Parekh
(74) *Attorney, Agent, or Firm* — Slater Matsil, LLP

(57) ABSTRACT

A method includes forming an interposer, which includes forming a rigid dielectric layer, and removing portions of the rigid dielectric layer. The method further includes bonding a package component to an interconnect structure, and bonding the interposer to the interconnect structure. A spacer in the interposer has a bottom surface contacting a top surface of the package component, and the spacer includes a feature selected from the group consisting of a metal feature, the rigid dielectric layer, and combinations thereof. A die-saw is performed on the interconnect structure.

20 Claims, 32 Drawing Sheets

Related U.S. Application Data division of application No. 16/118,538, filed on Aug. 31, 2018, now Pat. No. 11,075,151.

(60) Provisional application No. 62/692,027, filed on Jun. 29, 2018.

(51) Int. Cl.
    *H01L 23/00*     (2006.01)
    *H01L 23/498*     (2006.01)

(52) U.S. Cl.
    CPC ............... *H01L 2224/02379* (2013.01); *H01L 2924/3511* (2013.01)

(58) Field of Classification Search
    USPC .......................................................... 257/774
    See application file for complete search history.

(56) References Cited

U.S. PATENT DOCUMENTS

| | | | |
|---|---|---|---|
| 8,664,751 B2 * | 3/2014 | Kim | H01L 23/552 |
| | | | 257/659 |
| 8,779,562 B2 | 7/2014 | Lee et al. | |
| 8,980,691 B2 | 3/2015 | Lin | |
| 9,252,031 B2 | 2/2016 | Im et al. | |
| 9,349,713 B2 | 5/2016 | Kim et al. | |
| 9,728,498 B2 | 8/2017 | Su et al. | |
| 9,735,131 B2 | 8/2017 | Su et al. | |
| 9,947,642 B2 | 4/2018 | Kumar et al. | |
| 10,103,132 B2 | 10/2018 | Lin et al. | |
| 10,546,844 B2 * | 1/2020 | Kim | H01L 25/105 |
| 11,056,436 B2 * | 7/2021 | Lin | H01L 21/486 |
| 2009/0243065 A1 * | 10/2009 | Sugino | H01L 23/3128 |
| | | | 257/E23.116 |
| 2010/0059854 A1 * | 3/2010 | Lin | H01L 21/6835 |
| | | | 257/E27.114 |
| 2011/0316147 A1 | 12/2011 | Shih et al. | |
| 2012/0196406 A1 * | 8/2012 | Pendse | H01L 23/49811 |
| | | | 257/E21.502 |
| 2012/0241977 A1 | 9/2012 | Gluschenkov et al. | |
| 2012/0307140 A1 * | 12/2012 | Wang | H02K 41/0356 |
| | | | 348/374 |
| 2013/0241080 A1 | 9/2013 | Pagaila | |
| 2013/0270682 A1 * | 10/2013 | Hu | H01L 25/50 |
| | | | 257/E21.705 |
| 2013/0307140 A1 * | 11/2013 | Huang | H01L 23/3128 |
| | | | 257/737 |
| 2014/0063768 A1 * | 3/2014 | Tanaka | H05K 1/185 |
| | | | 29/830 |
| 2014/0091455 A1 | 4/2014 | Strothmann et al. | |
| 2014/0273348 A1 | 9/2014 | Yim et al. | |
| 2014/0339706 A1 | 11/2014 | Yee et al. | |
| 2015/0249065 A1 * | 9/2015 | Pagaila | H01L 25/105 |
| | | | 257/737 |
| 2015/0287672 A1 * | 10/2015 | Yazdani | H01L 23/49827 |
| | | | 257/774 |
| 2016/0085899 A1 * | 3/2016 | Qian | H01L 21/4857 |
| | | | 257/774 |
| 2016/0118333 A1 | 4/2016 | Lin | |
| 2016/0190107 A1 | 6/2016 | Meyer et al. | |
| 2016/0218049 A1 | 7/2016 | Lin et al. | |
| 2017/0084589 A1 | 3/2017 | Kuo et al. | |
| 2017/0207205 A1 | 7/2017 | Kim et al. | |
| 2018/0108638 A1 | 4/2018 | Lin et al. | |

FOREIGN PATENT DOCUMENTS

| | | |
|---|---|---|
| CN | 108140639 A | 6/2018 |
| KR | 20150033133 A | 4/2015 |
| KR | 20160012589 A | 2/2016 |
| KR | 20170061468 A | 6/2017 |

\* cited by examiner

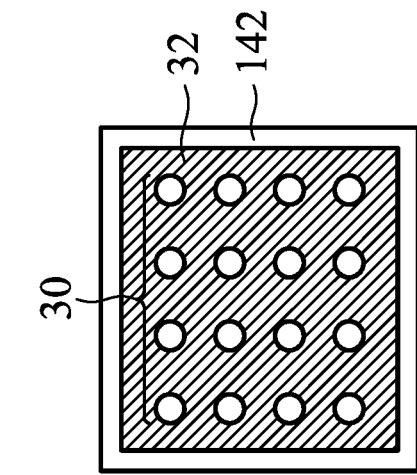
FIG. 23A
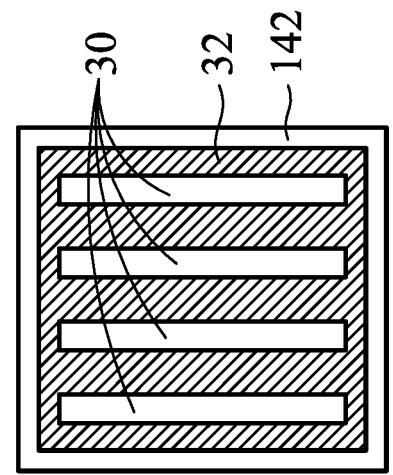
FIG. 23B
FIG. 23C
FIG. 23D

FAN-OUT PACKAGE WITH CONTROLLABLE STANDOFF

PRIORITY CLAIM AND CROSS-REFERENCE

This application is a continuation of U.S. patent application Ser. No. 17/383,953, entitled "Fan-Out Package with Controllable Standoff," filed Jul. 23, 2021, which is a divisional of U.S. patent application Ser. No. 16/118,538, entitled "Fan-Out Package with Controllable Standoff," filed on Aug. 31, 2018, now U.S. Pat. No. 11,075,151, issued Jul. 27, 2021, which claims the benefit of the U.S. Provisional Application No. 62/692,027, filed Jun. 29, 2018, and entitled "Fan-out Package with Controllable Standoff," which applications are hereby incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. Since the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, solder balls must have a certain size, which in turn limits the number of solder balls that can be packed on the surface of a die.

In the other category of packaging, dies are sawed from wafers before they are packaged. An advantageous feature of this packaging technology is the possibility of forming fan-out packages, which means the I/O pads on a die can be redistributed to a greater area than the die, and hence the number of I/O pads packed on the surfaces of the dies can be increased. Another advantageous feature of this packaging technology is that "known-good-dies" are packaged, and defective dies are discarded, and hence cost and effort are not wasted on the defective dies. The fan-out packages suffer from warpages. This causes difficulty in the bonding of the fan-out packages to package substrate, and the respective solder join may fail.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 11A illustrate the cross-sectional views of intermediate stages in the formation of an interposer in accordance with some embodiments.

FIGS. 12 through 19A illustrate the cross-sectional views of intermediate stages in the formation of a package including an interposer and a fan-out package in accordance with some embodiments.

FIGS. 23A, 23B, 23C, and 23D illustrate the top views of metal spacers in accordance with some embodiments.

DETAILED DESCRIPTION

Figure 1:
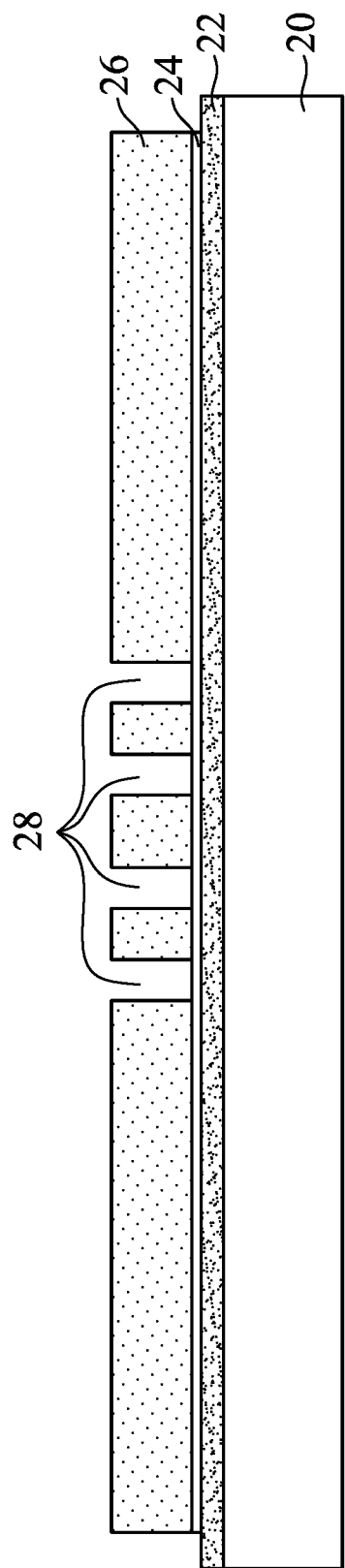

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package including an interposer and a fan-out package and the method of forming the same are provided in accordance with various embodiments. The intermediate stages of forming the package are illustrated in accordance with some embodiments. Some variations of some embodiments are discussed. Throughout the various views and illustrative embodiments, like reference numbers are used to designate like elements. In accordance with some embodiments of the present disclosure, the interposer is built to include a metal spacer and/or a rigid dielectric layer, and the body of the interposer is built from the metal spacer and/or the rigid dielectric layer. The rigid dielectric layer is then patterned. The interposer is bonded to a Fan-Out package, with the metal spacer and/or the rigid dielectric layer used to define the standoff distance between the interposer and package.

Figure 24:
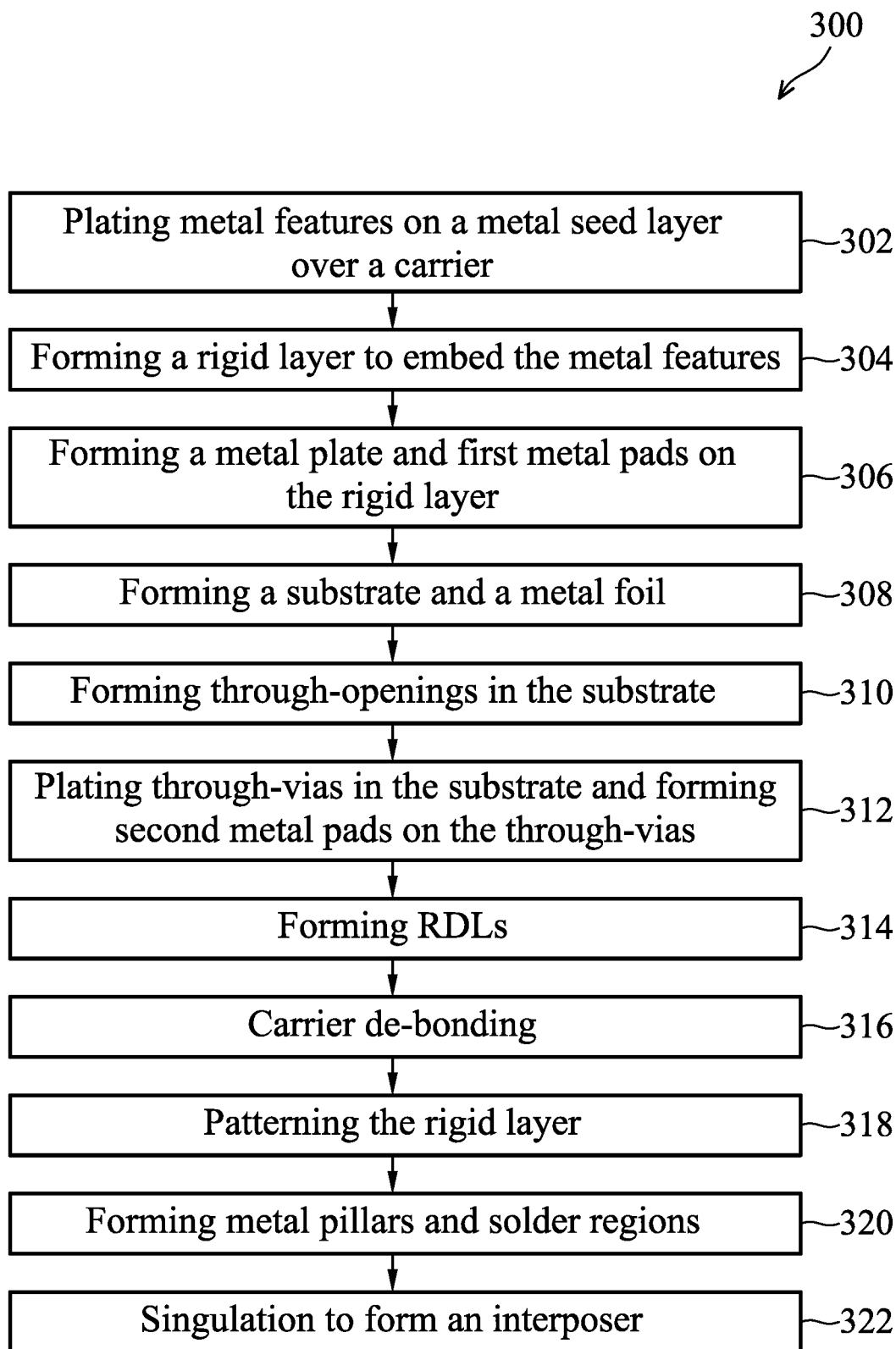
FIGS. 24 and 25 illustrate the process flows for forming a package in accordance with some embodiments.

FIGS. 1 through 11A illustrate the cross-sectional views of intermediate stages in the formation of an interposer in accordance with embodiments. The steps shown in FIG. 1 through 11A are also illustrated schematically in the process flow 300 as shown in FIG. 24.

FIG. 1 illustrates carrier 20 and release film 22 formed on carrier 20. Carrier 20 may be a glass carrier, a ceramic carrier, or the like. Carrier 20 may have a round top-view shape, and may have a size of a silicon wafer. For example, carrier 20 may have an 8-inch diameter, a 12-inch diameter, or the like. Release film 22 may be formed of a polymer-based material (such as a Light-To-Heat-Conversion (LTHC) material), which may be removed along with carrier 20 from the overlying structures that will be formed in subsequent steps. Release film 22 may be coated onto carrier 20.

Metal seed layer 24 is formed on release film 22. In accordance with some embodiments of the present disclosure, metal seed layer 24 includes a titanium layer and a copper layer over the titanium layer. The seed layer may also be a single layer, which may be a copper layer. Metal seed layer 24 may be formed using, for example, Physical Vapor Deposition (PVD).

Plating mask 26 is formed over metal seed layer 24, and is then patterned, for example, through a photo lithography process. In accordance with some embodiments of the present disclosure, plating mask 26 is formed of a photo resist. Openings 28 are formed in plating mask 26, with metal seed layer 24 having some portions exposed to openings 28.

Figure 2:
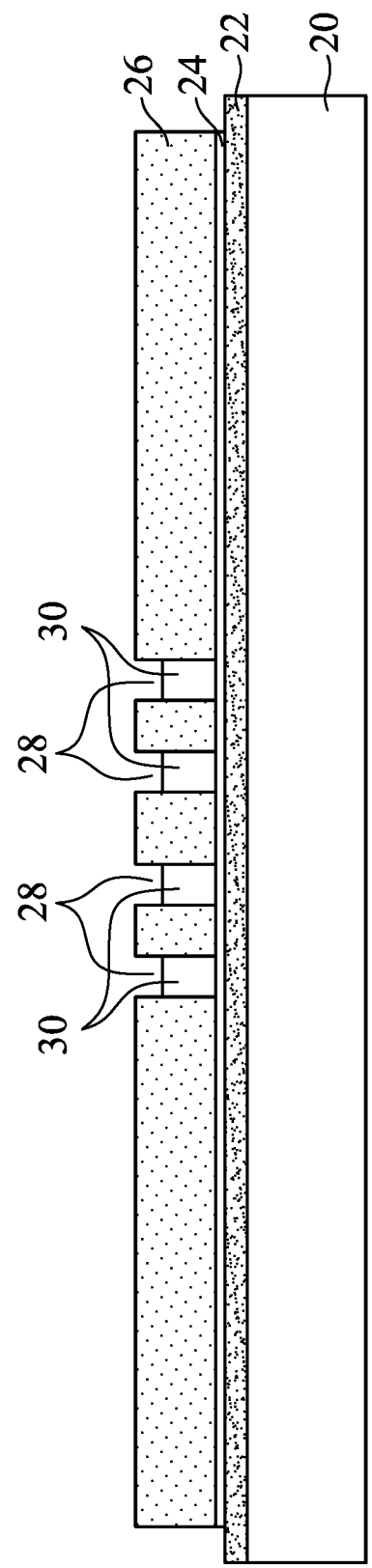

Referring to FIG. 2, a plating process is performed to plate a metallic material on the exposed portions of metal seed layer 24 to form metal features 30, which are referred to as metal spacers 30 throughout the description. The respective process is illustrated as process 302 in the process flow shown in FIG. 24. The plated metallic material may include copper, aluminum, tungsten, or the like. The plating may be performed using, for example, electrochemical plating, electro-less plating, or the like. Openings 28 confine the formed metal spacers 30 to have desirable shapes. Plating mask 26 is then removed, leaving metal spacers 30 on metal seed layer 24. The removal of metal spacers 30 may be through an ashing process. Metal seed layer 24 is thus exposed. Some examples of the top-view shapes of metal spacers 30 are shown in FIGS. 23A, 23B, 23C, and 23D, and will be discussed in subsequent paragraphs.

Figure 3:
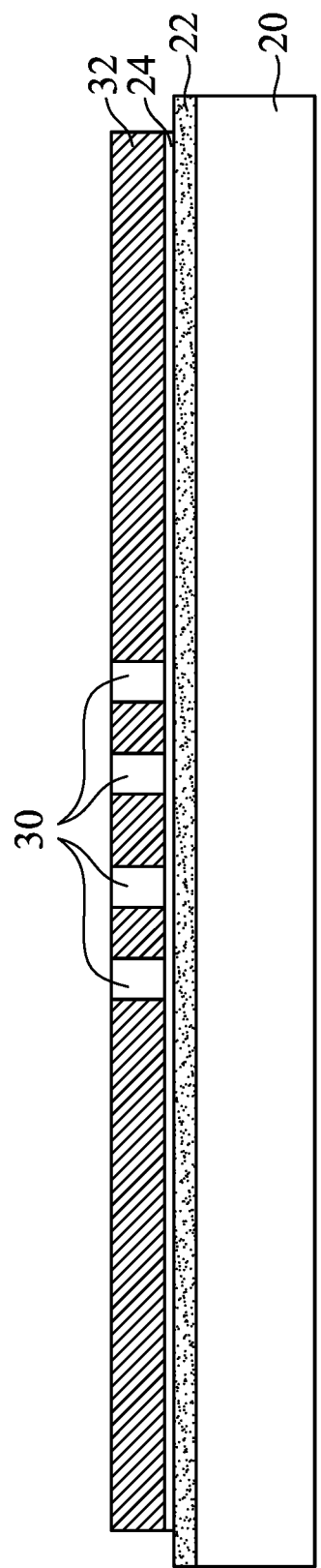
Figure 19A:
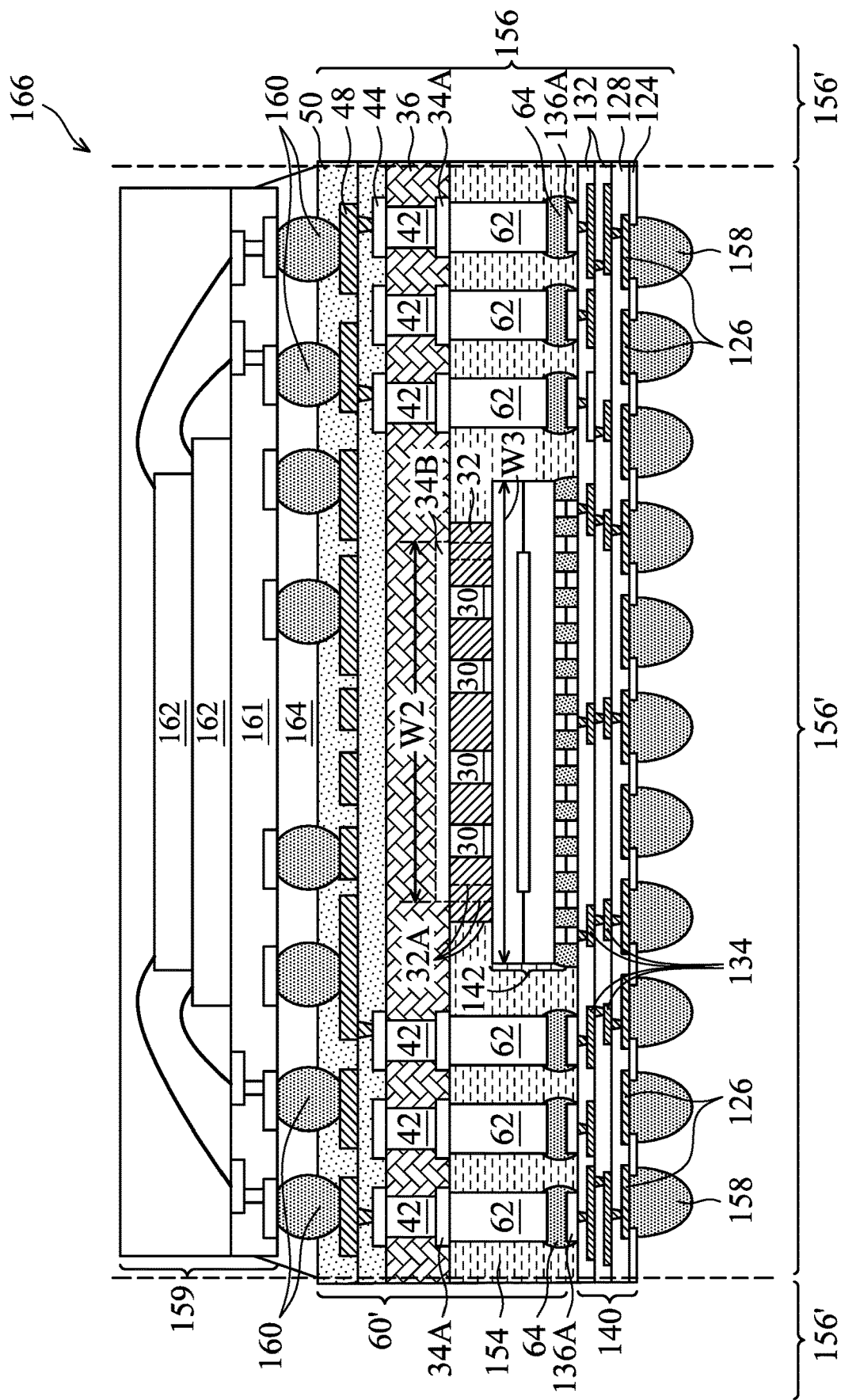

Next, referring to FIG. 3, rigid layer 32 is formed to embed metal spacers 30 therein. The respective process is illustrated as process 304 in the process flow shown in FIG. 24. In accordance with some embodiments of the present disclosure, rigid layer 32 is formed of a dielectric material such as a polymer, which may be an Ajinomoto Build-up Film (ABF) or the like in some embodiments. Rigid layer 32 is such name since it is rigid enough to resist the warpage of the overlying interposer 60' (FIG. 19A, for example). The formation process may include laminating a pre-formed film (such as an ABF film) on metal spacers 30, and thermal setting the film by heating and pressing. A planarization process such as a Chemical Mechanical Polishing (CMP) process or a mechanical grinding process is then preformed to level the top surfaces of metal spacers 30 and rigid layer 32. As a result, metal spacers 30 are embedded inside, and surrounded by, rigid layer 32, with the top surfaces of metal spacers 30 being coplanar with the top surface of rigid layer 32. In accordance with other embodiments, the formation of rigid layer 32 includes dispensing a flowable material such as a polymer, curing the flowable material, and performing a planarization process. In accordance with yet other embodiments, the formation of rigid layer 32 includes depositing an inorganic material such as silicon oxide, silicon, nitride, or the like, and then performing the planarization.

Figure 4:
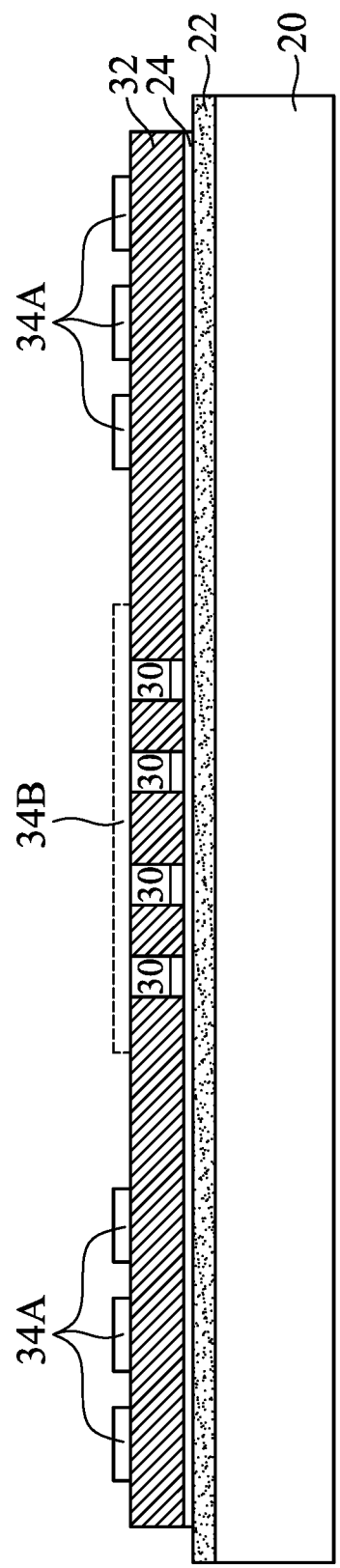

FIG. 4 illustrates the formation of metal pads 34A. The respective process is illustrated as process 306 in the process flow shown in FIG. 24. In accordance with some embodiments of the present disclosure, metal pads 34A are formed through plating. The formation may include forming a metal seed layer, forming and patterning a plating mask (such as photo resist, not shown), plating metal pads 34A in the openings in the plating mask, removing the plating mask, and etching the portions of the metal seed layer previously covered by the plating mask. In accordance with other embodiments, the formation of the metal seed layer is skipped, with metal pads 34A plated in the plating mask without using the metal seed layer. The metal seed layer (if formed) may be formed of a copper layer, a composite layer including a titanium layer and a copper layer over the titanium layer, or the like.

In accordance with some embodiments of the present disclosure, metal pad 34B is formed at the same time metal pads 34A are formed, and metal pad 34B share the same formation processes as metal pads 34A. The respective process is also illustrated as process 306 in the process flow shown in FIG. 24. In accordance with other embodiments of the present disclosure, metal pad 34B is not formed. Accordingly, metal pad 34B is illustrated as being dashed to indicate that it may or may not be formed. Metal pads 34A and 34B are individually and collectively referred to as metal pads 34. Metal pad 34B may not be used for electrical connection, and is alternatively referred to as a metal plate to distinguish from metal pads 34A, which are used for electrical connection.

Figure 5:
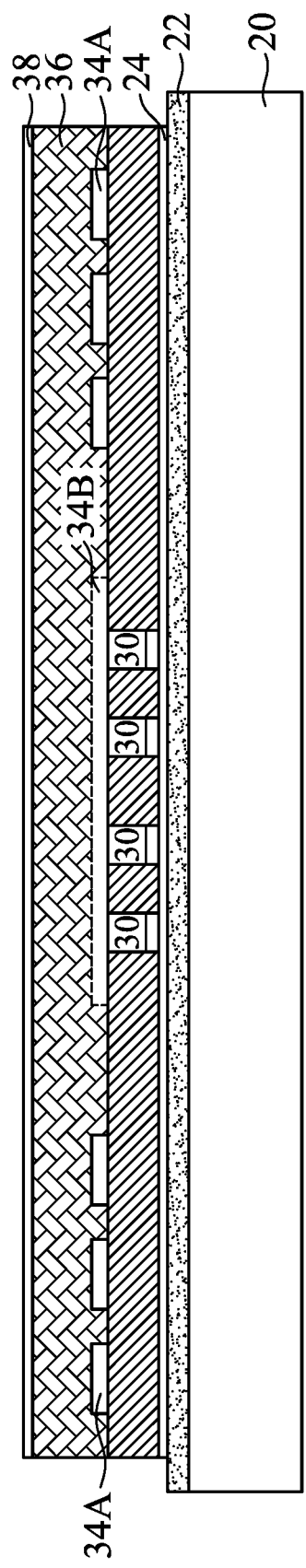

FIG. 5 illustrates the formation (or adhesion) of substrate 36 and the lamination of metal foil 38. The respective process is illustrated as process 308 in the process flow shown in FIG. 24. Throughout the description, substrate 36 is alternatively referred to as a barrier layer. In accordance with some embodiments of the present disclosure, substrate 36 is formed by laminating a dielectric film such as a prepreg film on metal pads 34. In accordance with alternative embodiments, substrate 36 is formed by coating a flowable dielectric material such as a polymer on metal pads 34, and then curing the flowable dielectric material. In accordance with yet other embodiments, substrate 36 is formed by depositing (such as using a chemical vapor deposition method) a dielectric material or adhering a dielectric plate (such as a silicon oxide plate, a silicon nitride plate, or the like) through an adhesive film (not shown). The adhesive film thus will embed metal pads 34 in, and will have its top surface contacting substrate 36. Substrate 36 may include fiber therein. In accordance with yet other embodiments, substrate 36 is formed by depositing a semiconductor material (such as silicon) or adhering a semiconductor plate (such as a silicon substrate) through an adhesive film (not shown). Metal foil 38 may formed of copper, aluminum, or other like metallic materials.

Figure 6:
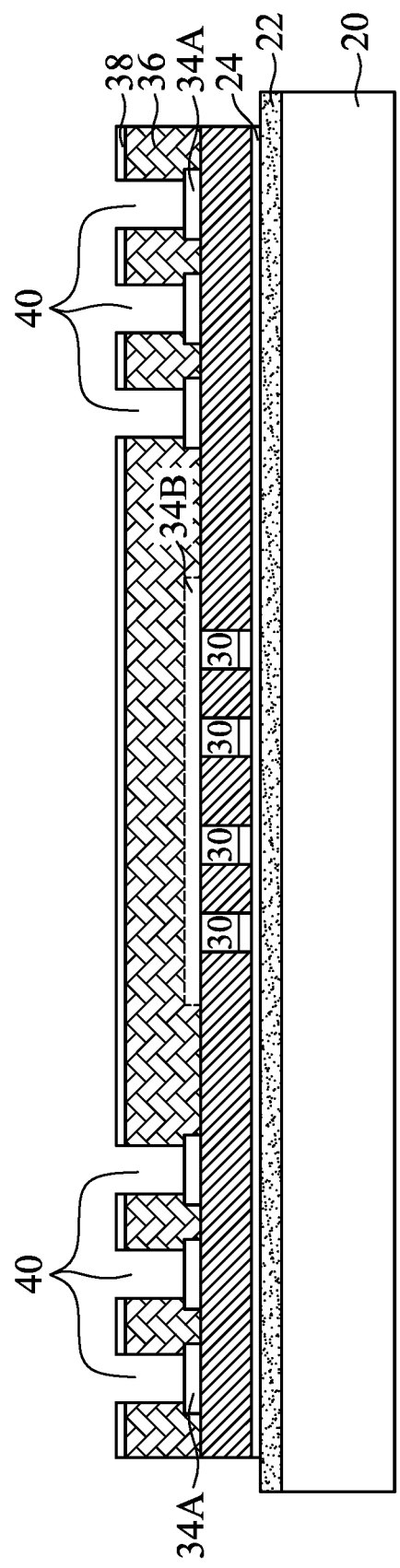

FIG. 6 illustrates the formation of openings 40 penetrating through substrate 36 and metal foil 38. The respective process is illustrated as process 310 in the process flow shown in FIG. 24. The formation method includes laser drilling, etching, or the like. Metal pads 34A are thus exposed through openings 40. On the other hand, metal plate 34B is covered by substrate 36 and metal foil 38, and is not exposed.

Figure 7:
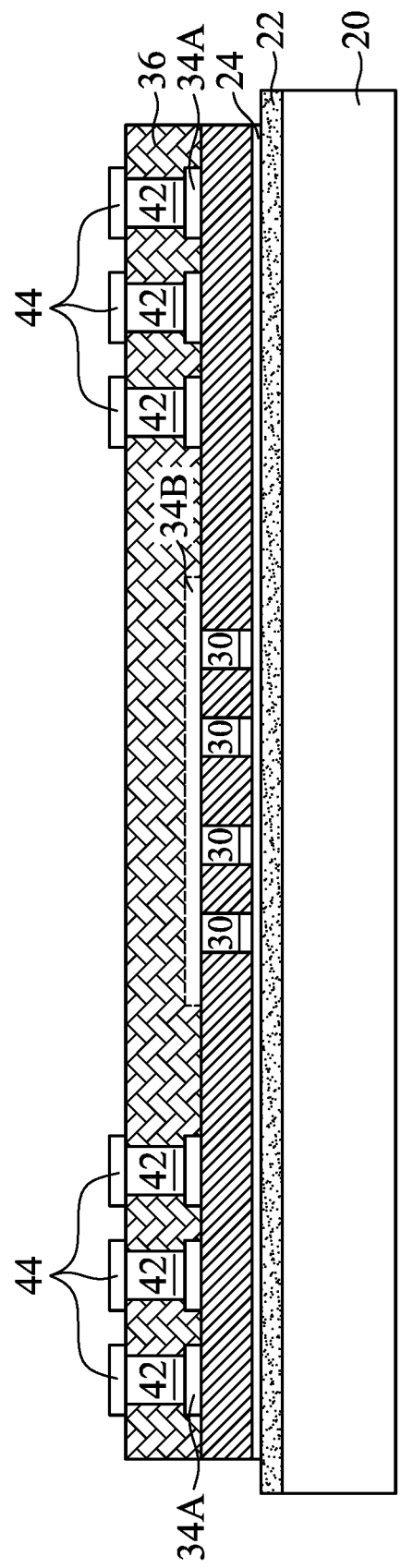

The structure as shown in FIG. 6 is then cleaned, for example, in a desmear process to remove byproducts and residues generated in preceding processes. A plating process is then performed to form through-vias 42 in substrate 36, as shown in FIG. 7. The respective process is illustrated as process 312 in the process flow shown in FIG. 24. In accordance with some embodiments in which substrate 36 is formed of a semiconductor material such as silicon, isolation layers may be formed to encircle through-vias 42 in order to electrically insulate through-vias 42 from substrate 36. A patterning process is also performed to form metal pads 44, which may include the plated metallic material and possibly some portions of metal foil 38.

Figure 8:
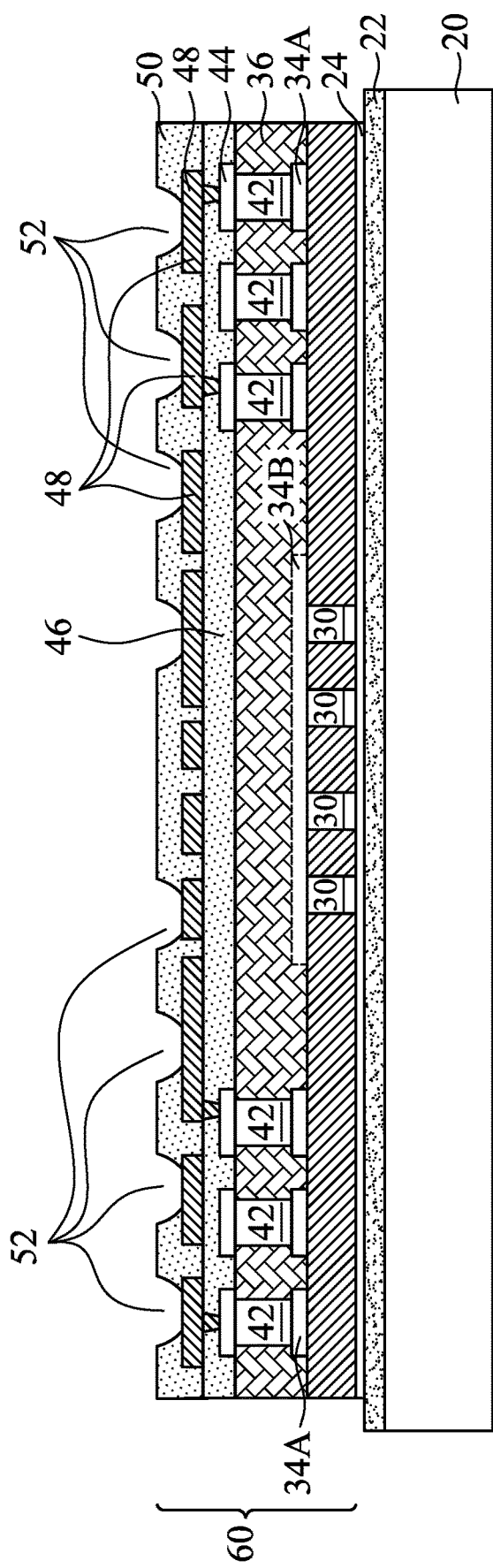

Referring to FIG. 8, dielectric layer 46 is formed over metal pads 44 and substrate 36. Dielectric layer 46 may be formed using an organic material, which may be selected from polybenzoxazole (PBO), polyimide, benzocyclobutene (BCB), or the like. Alternatively, dielectric layer 46 may include a non-organic dielectric material such as silicon oxide, silicon nitride, silicon carbide, silicon oxynitride, or the like. Openings (occupied by Redistribution Lines (RDLs) 48) are formed in dielectric layer 46 to expose metal pads 44. The openings may be formed through a photo lithography process.

Next, RDLs 48 are formed to electrically connect to metal pads 44 and through-vias 42. The respective process is illustrated as process 314 in the process flow shown in FIG. 24. RDLs 48 include metal traces (metal lines) over dielectric layer 46 as well as vias extending into the openings in dielectric layer 46 to electrically connect to metal pads 44. In accordance with some embodiments of the present disclosure, RDLs 48 are formed in a plating process, wherein each of RDLs 48 includes a seed layer and a plated metallic material over the seed layer. The seed layer and the plated material may be formed of the same material or different materials. For example, the seed layer may be formed of metals such as titanium, copper, or may include a titanium layer and a copper layer over the titanium layer. The plated metallic material may include copper or other metals.

An additional dielectric layer 50 is formed to cover RDLs 48 and dielectric layer 46. Dielectric layer 50 may be formed of a material selected from the same candidate materials for forming dielectric layer 46. Openings 52 are then formed in dielectric layer 50 to expose the metal pad portions of RDLs 48. Openings 52 may be formed through laser drilling, etching, or the like. Throughout the description, the portions of the structure including seed layer 24, rigid layer 32, spacers 30, and the overlying features are in combination referred to as interposer wafer 60.

Figure 9:
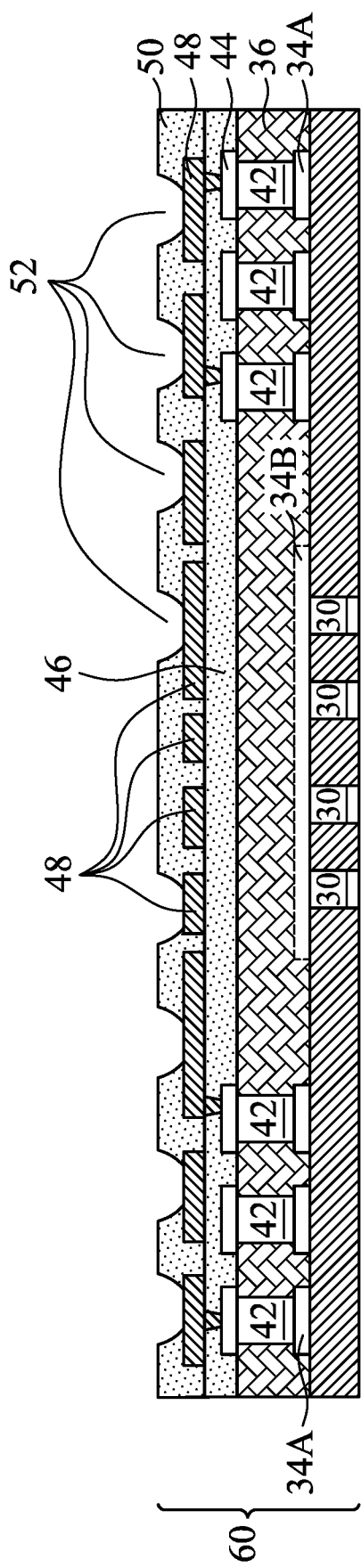

Interposer wafer 60 is then de-bonded from carrier 20. The respective process is illustrated as process 316 in the process flow shown in FIG. 24. The de-bonding may be performed by projecting a light (such as a laser beam) on release film 22, and the light penetrates through the transparent carrier 20. The release film 22 is thus decomposed, and interposer wafer 60 is released from carrier 20. Metal seed layer 24 is then removed, for example, through etching. The resulting interposer wafer 60 is illustrated in FIG. 9.

Figure 10:
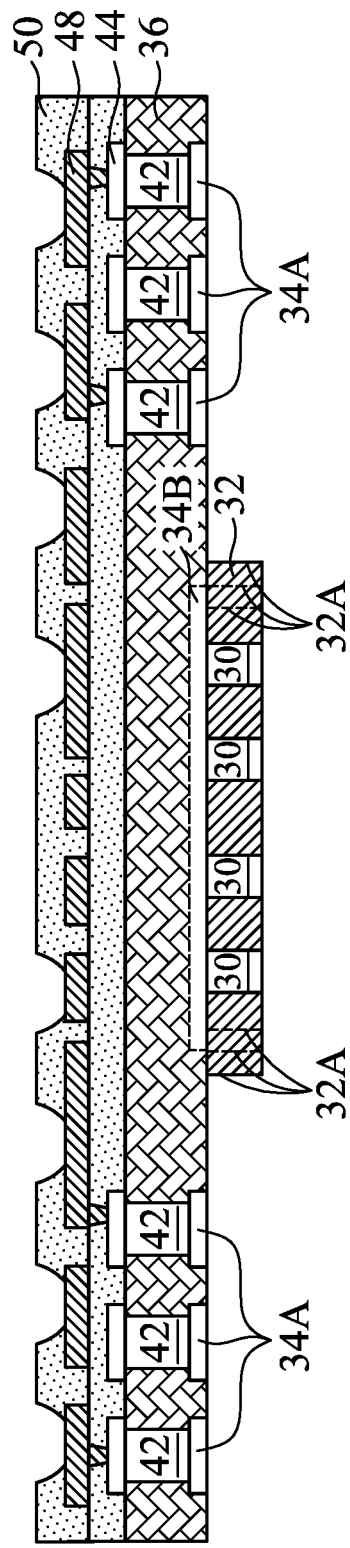

FIG. 10 illustrates the patterning of rigid layer 32 in order to reveal metal pads 34A. The respective process is illustrated as process 318 in the process flow shown in FIG. 24. The patterning may include an etching process, in which a photo lithography process is included. In accordance with some embodiments of the present disclosure, rigid layer 32 includes a portion directly underlying metal plate 34B (if formed). The remaining rigid layer 32 may have different sizes relative to the size of metal plate 34B. For example, FIG. 10 illustrates some examples of the positions of edges 32A. As represented by edges 32A, rigid layer 32 may have edges flushed with the respective edges of metal plate 34B. Rigid layer 32 may also have edges recessed from the edges of metal plate 34B, or may have portions extending beyond the edges of metal plate 34B.

Figure 11A:
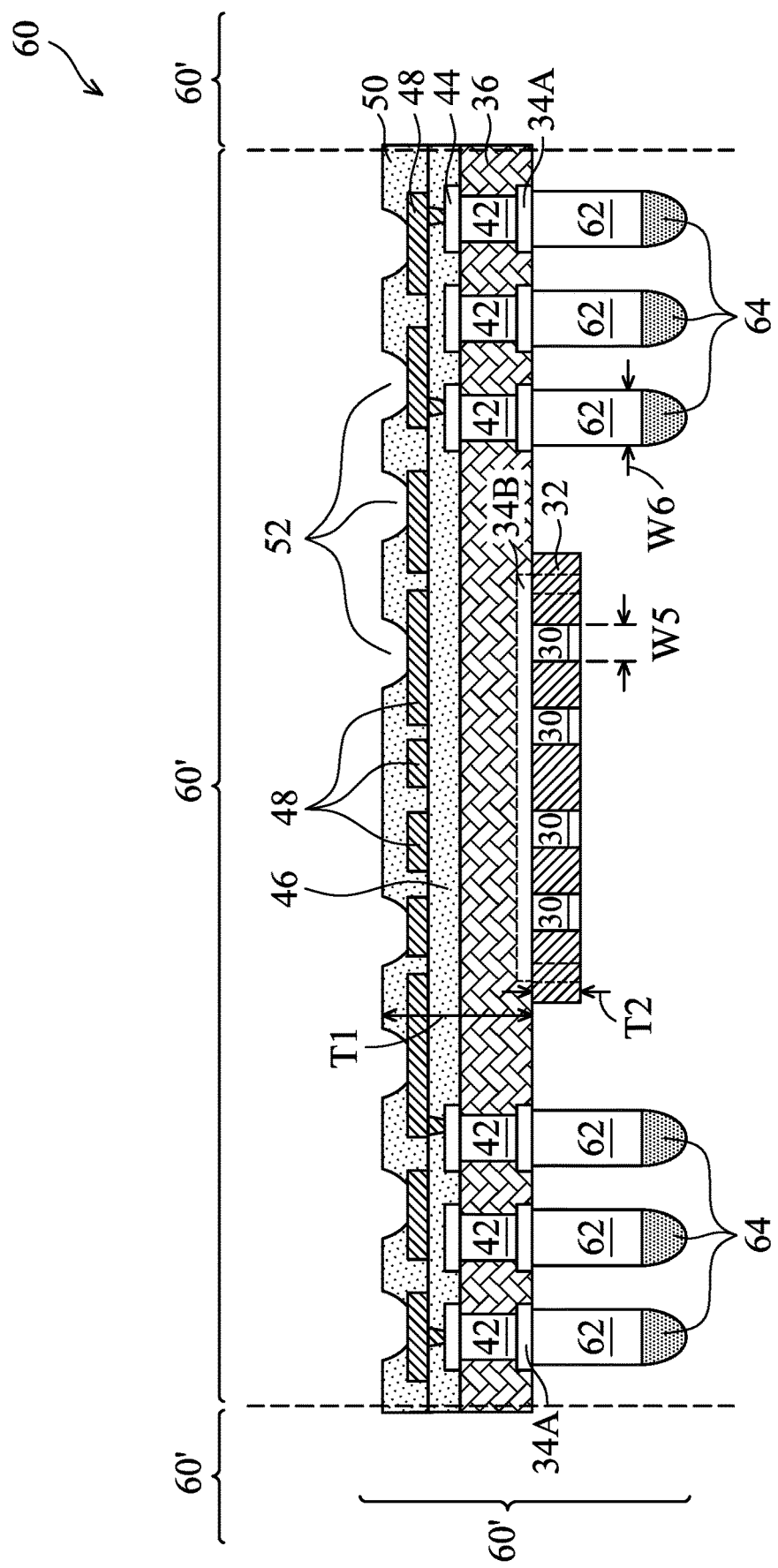

FIG. 11A illustrates the continued formation of interposer wafer 60. In accordance with some embodiments, metal pillars 62 are formed to connect to metal pads 34A. The respective process is illustrated as process 320 in the process flow shown in FIG. 24. The formation process includes flipping interposer wafer 60 upside down, forming a patterned plating mask (such as a photo resist, not shown) over interposer wafer 60, plating metal pillars 62, and removing the plating mask. Solder regions 64 may also be plated on metal pillar 62 using the plating mask. A reflow process may be performed to reflow solder regions 64. After the formation of interposer wafer 60, a singulation process may be performed to saw-through interposer wafer 60 in order to form a plurality of identical interposers 60'.

Figure 11B:
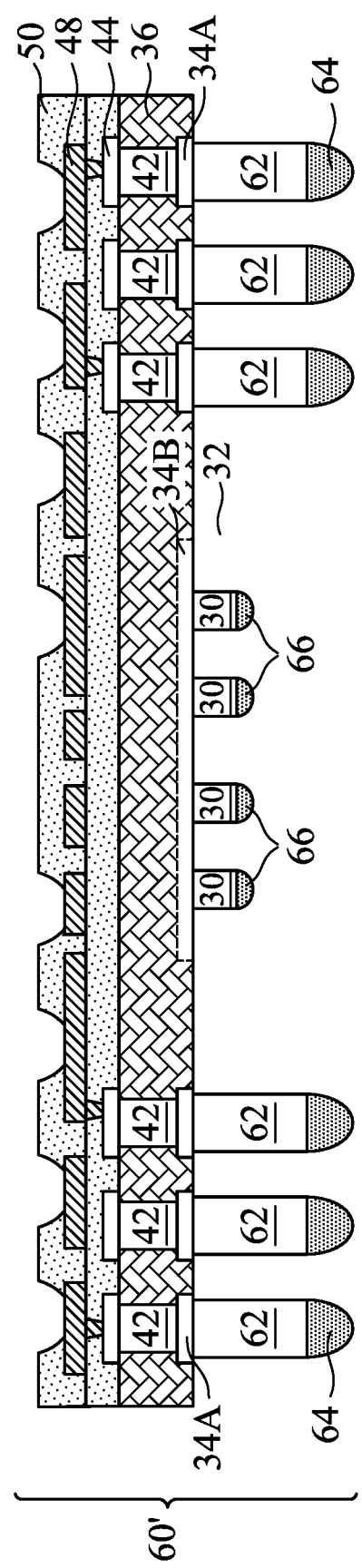
FIGS. 11B, 11C, and 11D illustrate the cross-sectional views of interposers in accordance with some embodiments.

FIG. 11B illustrates the cross-sectional view of interposer 60' in accordance with alternative embodiments. The interposer 60' as shown in FIG. 11B is similar to the interposer 60' as shown in FIG. 11A, except that all of rigid layer 32 (FIG. 9) is removed, and solder regions 66 are formed on metal spacers 30. The processes for forming the interposer 60' as shown in FIG. 11B are similar to what are shown in FIGS. 1 through 11A, except that in the patterning of rigid layer 32 (FIG. 10), all of rigid layer 32 are removed. An additional plating process may be performed to plate solder on metal spacers 30, and solder regions 66 are reflowed along with solder regions 64. Solder regions 64 and 66 may be formed of lead-free solders. In accordance with some embodiments of the present disclosure, metal spacers 30 are discrete metal pillars, as shown in FIGS. 23A and 23B.

Figure 11C:
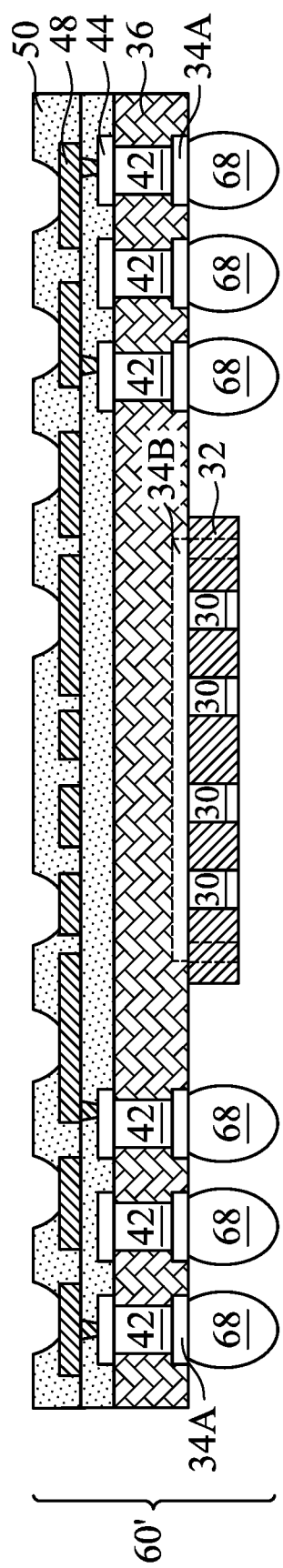

FIG. 11C illustrates the cross-sectional view of interposer 60' in accordance with alternative embodiments. The interposer 60' as shown in FIG. 11C is similar to the interposer 60' as shown in FIG. 11A, except that metal pillars 62 and solder regions 64 as shown in FIG. 11A are not formed. Instead, solder regions 68 are formed as parts of interposer 60'. Solder regions 68 may be formed by placing solder balls on metal pads 34A, followed by a reflow process. Alternatively, solder regions 68 may be formed by plating solder regions on metal pads 34A, followed by a reflow process. Solder regions 68 may also be formed of a lead-free solder.

Figure 11D:
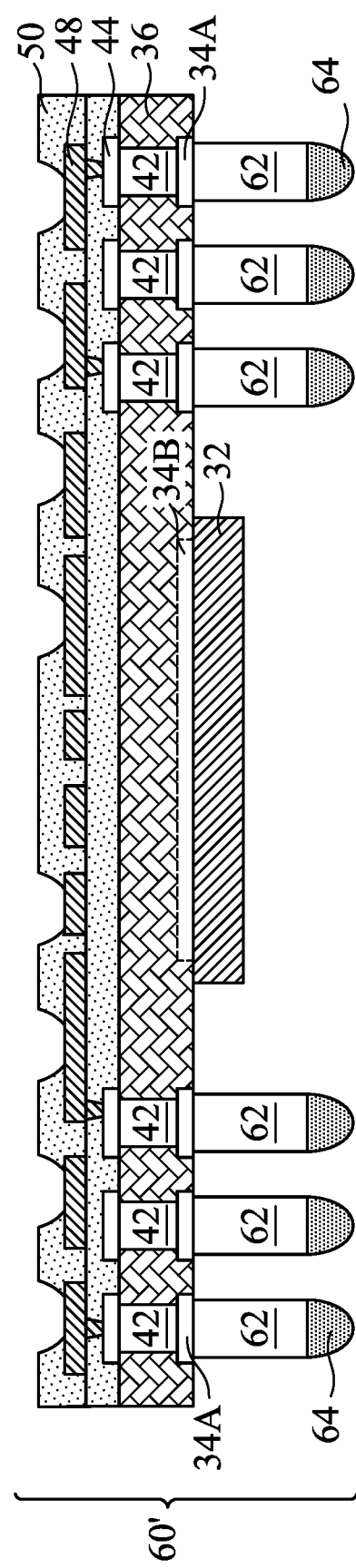

FIG. 11D illustrates the cross-sectional view of interposer 60' in accordance with alternative embodiments. The interposer 60' as shown in FIG. 11D is similar to the interposer 60' as shown in FIG. 11A, except that metal spacers 30 are not formed. The processes for forming the interposer 60' as shown in FIG. 11D are similar to what are shown in FIGS. 1 through 11A, except that the steps for forming metal spacers 30, which steps are shown in FIGS. 1 and 2, are skipped, while the steps illustrated in FIGS. 3 through 10 and 11C are performed.

The portion of interposer 60' (FIGS. 11A, 11B, 11C, and 11D) over rigid layer 32 has thickness T1 (marked in FIG. 11A), and rigid layer 32 has thickness T2. In accordance with some embodiments of the present disclosure, thickness T2 is smaller than about 1/3 of thickness T1. Ratio T2/T1 may also be in the range between about 1/5 and about 1/3. Thickness T1 may be in the range between about 50 nm and about 300 nm. Width W5 of metal spacers 30 may be in the range between about 20 μm and about 300 μm. Width W6 of metal pillars 62 may be in the range between about 50 μm and about 300 μm.

Figure 25:
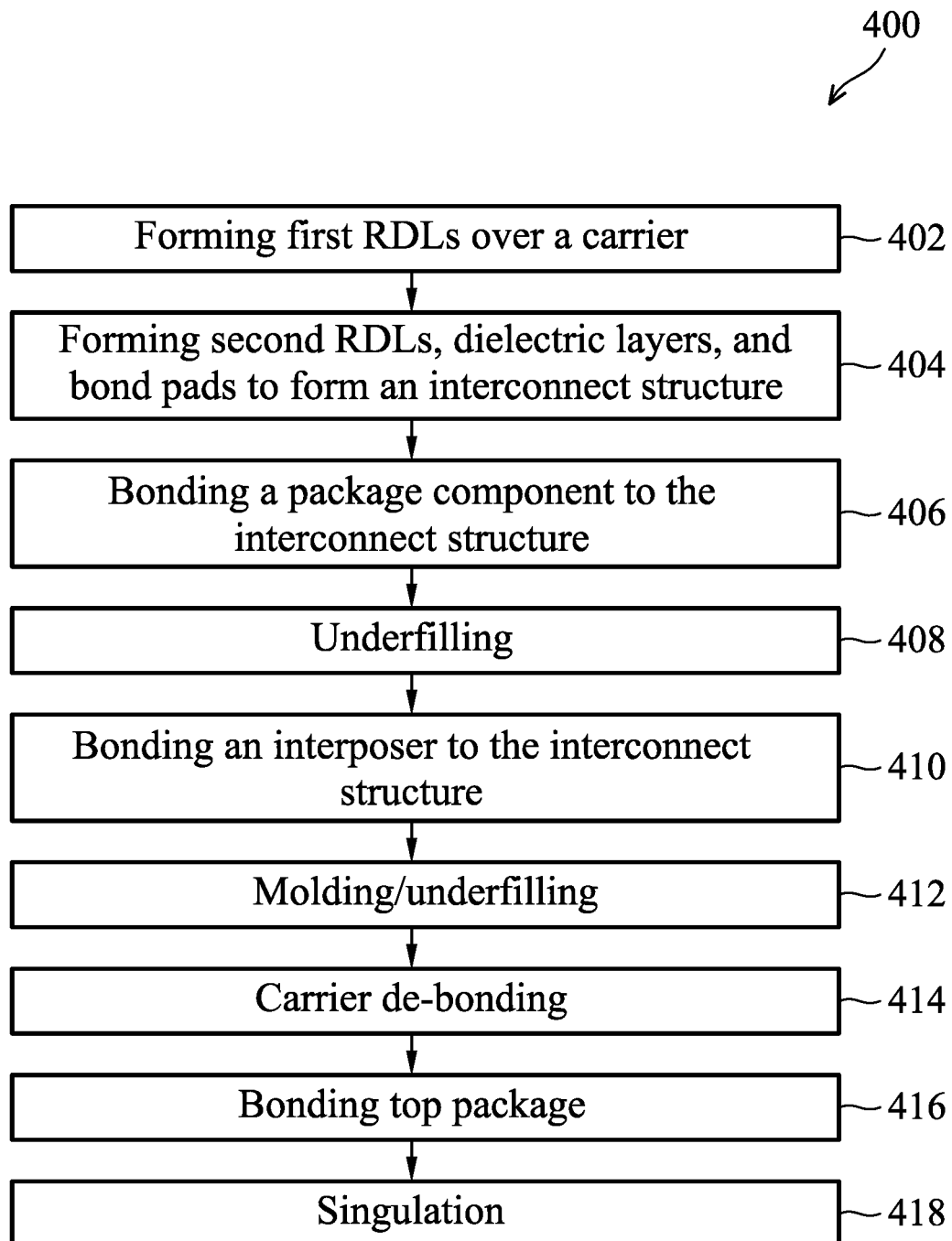

FIGS. 12 through 19A illustrate the cross-sectional views of intermediate stages in the formation of an InFO package, and the integration of the fan-out package with an interposer in accordance with some embodiments. The processes shown in FIGS. 12 through 19A are also reflected schematically in the process flow 400 as shown in FIG. 25.

Figure 12:
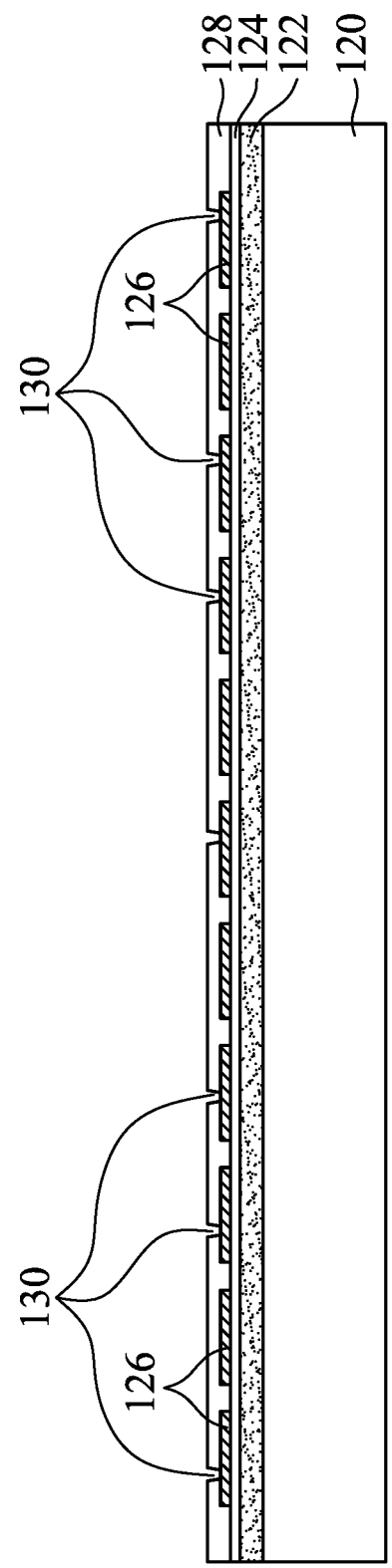

FIG. 12 illustrates carrier 120 and release film 122 formed on carrier 120. Carrier 120 may be a glass carrier, a silicon wafer, an organic carrier, or the like. Release film 122 may be formed of a polymer-based material such as LTHC. Dielectric layer 124 is formed on release film 122. In accordance with some embodiments of the present disclosure, dielectric layer 124 is formed of a polymer, which may be a photo-sensitive material such as PBO, polyimide, BCB, or the like.

RDLs 126 are formed over dielectric layer 124. The respective process is illustrated as process 402 in the process flow shown in FIG. 25. The formation of RDLs 126 may include forming a seed layer (not shown) over dielectric layer 124, forming a patterned plating mask (not shown) such as a photo resist over the seed layer, and then plating RDLs 126 on the exposed seed layer. The patterned plating mask and the portions of the seed layer covered by the patterned plating mask are then removed, leaving RDLs 126 as in FIG. 12. In accordance with some embodiments of the present disclosure, the seed layer includes a copper layer, or a composite layer including a titanium layer and a copper layer over the titanium layer. The seed layer may be formed using, for example, PVD. The plating may be performed using, for example, electro-less plating.

Further referring to FIG. 12, dielectric layer 128 is formed on RDLs 126. The bottom surface of dielectric layer 128 is in contact with the top surfaces of RDLs 126 and dielectric layer 124. In accordance with some embodiments of the present disclosure, dielectric layer 128 is formed of a polymer, which may be a photo-sensitive material such as PBO, polyimide, BCB, or the like. Dielectric layer 128 is then patterned to form openings 130 therein. Some portions of RDLs 126 are exposed through the openings 130 in dielectric layer 128.

Figure 13:
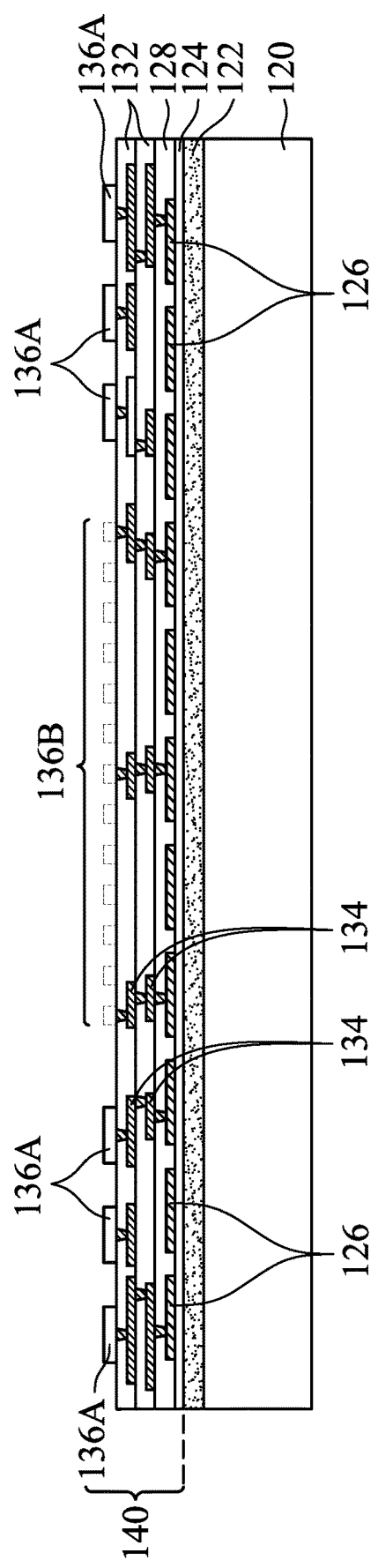

Next, referring to FIG. 13, dielectric layers 132 and RDLs 134 are formed over RDLs 126, with RDLs 134 being electrically connected to RDLs 126. RDLs 134 include metal traces (metal lines) over dielectric layer 128 and the respective dielectric layer 132. RDLs 134 also include vias extending into the openings in dielectric layer 128 and the respective dielectric layer 132. RDLs 134 may also be formed in plating processes, wherein each of RDLs 134 includes a seed layer (not shown) and a plated metallic material over the seed layer. The seed layer and the plated material may be formed of the same material or different materials. RDLs 134 may include a metal or a metal alloy including aluminum, copper, tungsten, or the like.

Dielectric layers 132 may be formed using polymers, which may be selected from the same group of candidate materials as those of dielectric layer 128. For example, dielectric layers 132 may be formed of PBO, polyimide, BCB, or the like. Alternatively, dielectric layers 132 may include a non-organic dielectric material such as silicon oxide, silicon nitride, silicon carbide, silicon oxynitride, or the like.

FIG. 13 further illustrates the formation of bond pads 136 (including 136A and 136B), which are electrically connected to RDLs 134. The formation of RDLs 134, dielectric layers 132, and bond pads 136 are illustrated as processes 404 in the process flow shown in FIG. 25. Bond pads 136 may include bond pads 136A and possibly bond pads 136B.

The formation of bond pads 136 may adopt the methods and materials similar to those for forming RDLs 134. It is appreciated that although in the illustrated examples of some embodiments, two RDL layers 134 and the respective dielectric layers are shown, fewer or more dielectric layers and RDL layers may be adopted, depending on the routing requirement. For example, there may be a single RDL layer or three, four, or more RDL layers. Throughout the description, the features over release film 122 in FIG. 13 are in combination referred to as interconnect structure 140.

Figure 14:
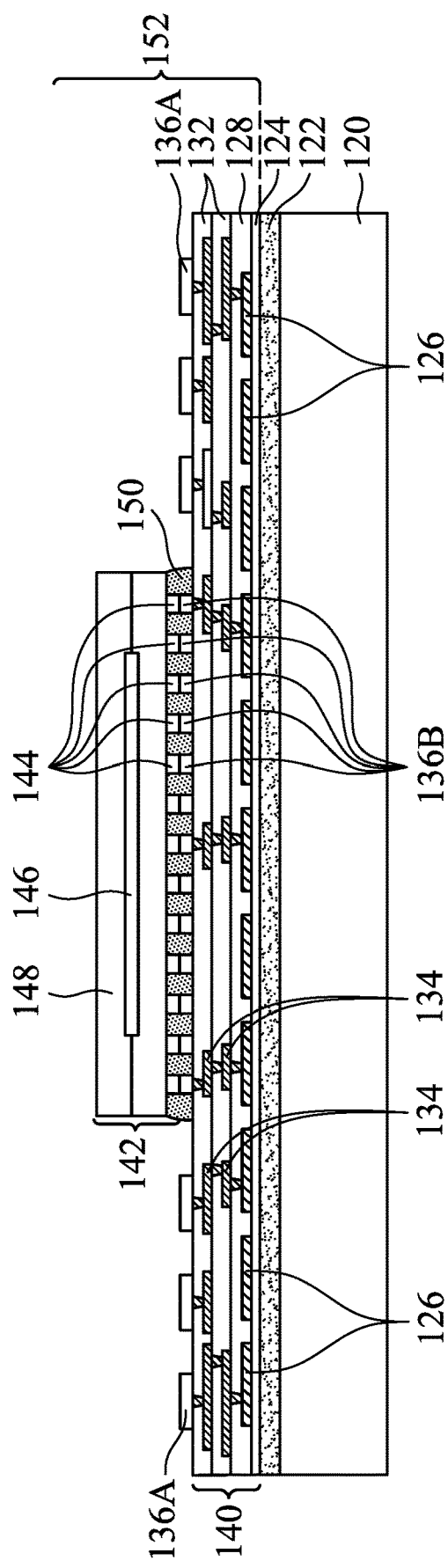

Next, referring to FIG. 14, package component 142 is bonded to interconnect structure 140. The respective process is illustrated as process 406 in the process flow shown in FIG. 25. In accordance with some embodiments of the present disclosure, package component 142 is a System-on-Chip (SoC) die. In accordance with alternative embodiments, package component 142 is a Central Processing Unit (CPU) die, a Graphic Processing Unit (GPU) die, a Micro Control Unit (MCU) die, an input-output (10) die, a Base-Band (BB) die, an Application processor (AP) die, a Radio Frequency Front End (RFFE) die, a Power Management IC (PMIC) die, or the like. Package component 142 may also be a package or a die stack including device dies therein. In addition, package component 142 may include different types of dies selected from the aforementioned types.

Package component 142 includes electrical connectors 144 bonded to bond pads 136B. Package component 142 may further include semiconductor substrate 148, which may be a silicon substrate. Integrated circuit devices 146, which may include active devices such as transistors and/or diodes, and passive devices such as capacitors, resistors, or the like are formed in package component 142. The bonding may be performed through solder bonding, metal-to-metal direct bonding, or the like. After the bonding of package component 142 to interconnect structure 140, underfill 150 is dispensed into the gap between package component 142 and interconnect structure 140, hence forming fan-out package 152. The respective process is illustrated as process 408 in the process flow shown in FIG. 25.

Figure 15:
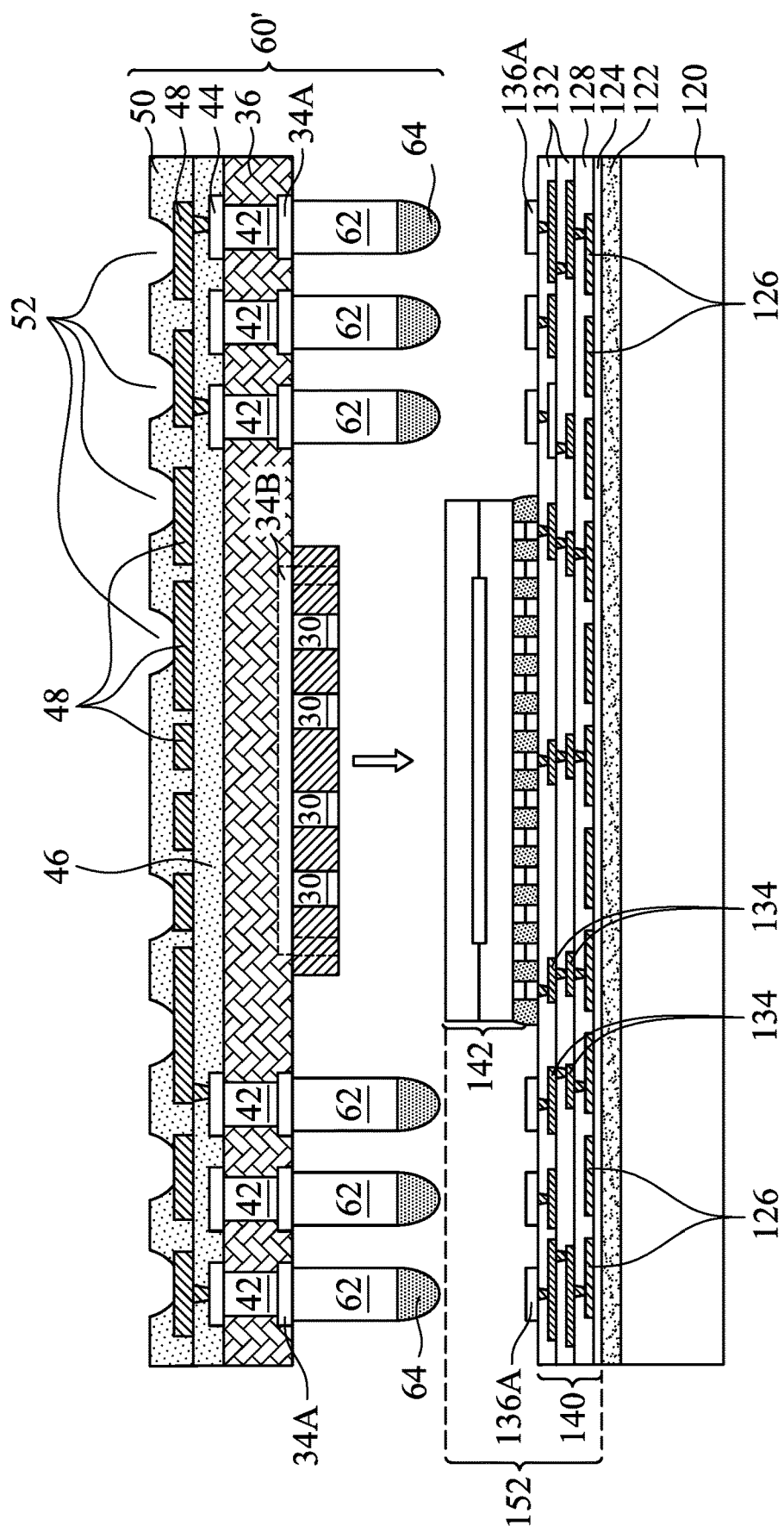
Figure 16:
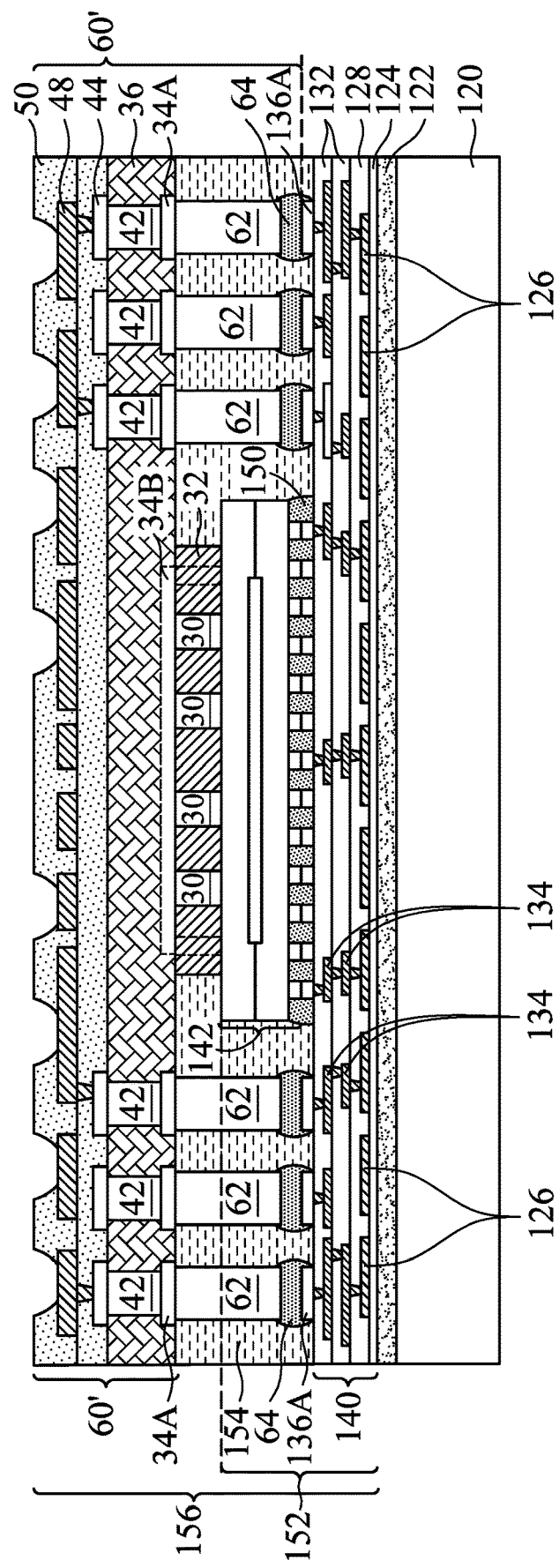

Next, as shown in FIG. 15, interposer 60' is aligned to the fan-out package 152. In accordance with some embodiments, the interposer 60' as shown in FIG. 11A is used. Solder regions 64 are placed on metal pads 136A. A reflow process is then performed to bond interposer 60' to fan-out package 152, with solder regions 64 joining metal pillars 62 to metal pads 136A. The resulting structure is shown in FIG. 16. The respective process is illustrated as process 410 in the process flow shown in FIG. 25. Metal pillars 62 may have their bottom surfaces lower than the bottom surfaces of rigid dielectric layer 32 and metal spacers 30.

After the bonding process, encapsulant 154 is dispensed into the gap between interposer 60' and fan-out package 152. The respective process is illustrated as process 412 in the process flow shown in FIG. 25. Package 156 is thus formed. In accordance with some embodiments of the present disclosure, encapsulant 154 includes a molding compound, which may be applied using transfer molding. In accordance with other embodiments of the present disclosure, encapsulant 154 includes an underfill.

The bottoms of metal spacers 30 and rigid layer 32 are in contact with the top surface of package component 142. Metal spacers 30 and rigid layer 32 have several functions. In the bonding process, metal spacers 30 and rigid layer 32 maintain the standoff distance between interposer 60' and package component 142, and prevent interposer 60' to be too close to package component 142. Also, with metal spacers 30 and rigid layer 32, solder regions 64 are prevented from being crushed to bridge to each other. Furthermore, with the metal spacers 30 and rigid layer 32 filling some center portions of the gap, voids are less likely to be formed between interposer 60' and package component 142. With the elimination of void and with the rigid metal spacers 30 and rigid layer 32 to maintain the standoff distance, the warpage of interpose 60' is reduced.

Figure 17:
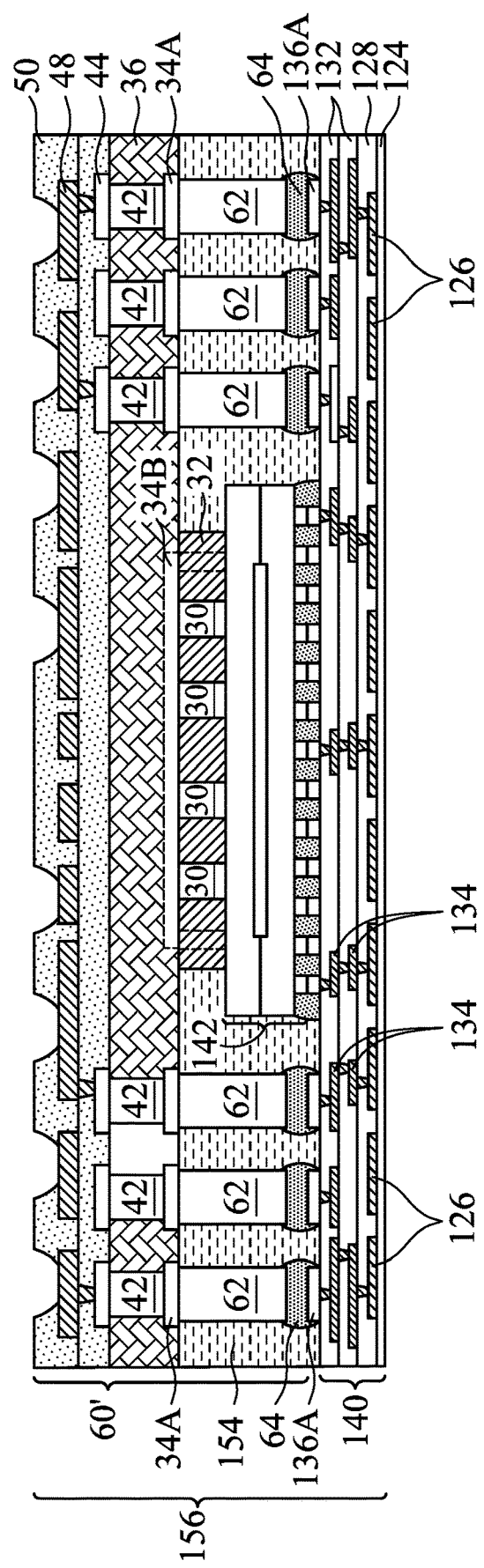

In a subsequent process, package 156 is de-bonded from carrier 120. The respective process is illustrated as process 414 in the process flow shown in FIG. 25. The de-bonding may be performed by projecting a light (such a laser beam) on release film 122, and the light penetrates through the transparent carrier 120. The release film 122 is thus decomposed, and package 156 is released from carrier 120. Dielectric layer 124 is thus revealed. The resulting package 156 is illustrated in FIG. 17. Package 156 may be a composite wafer.

Figure 18:
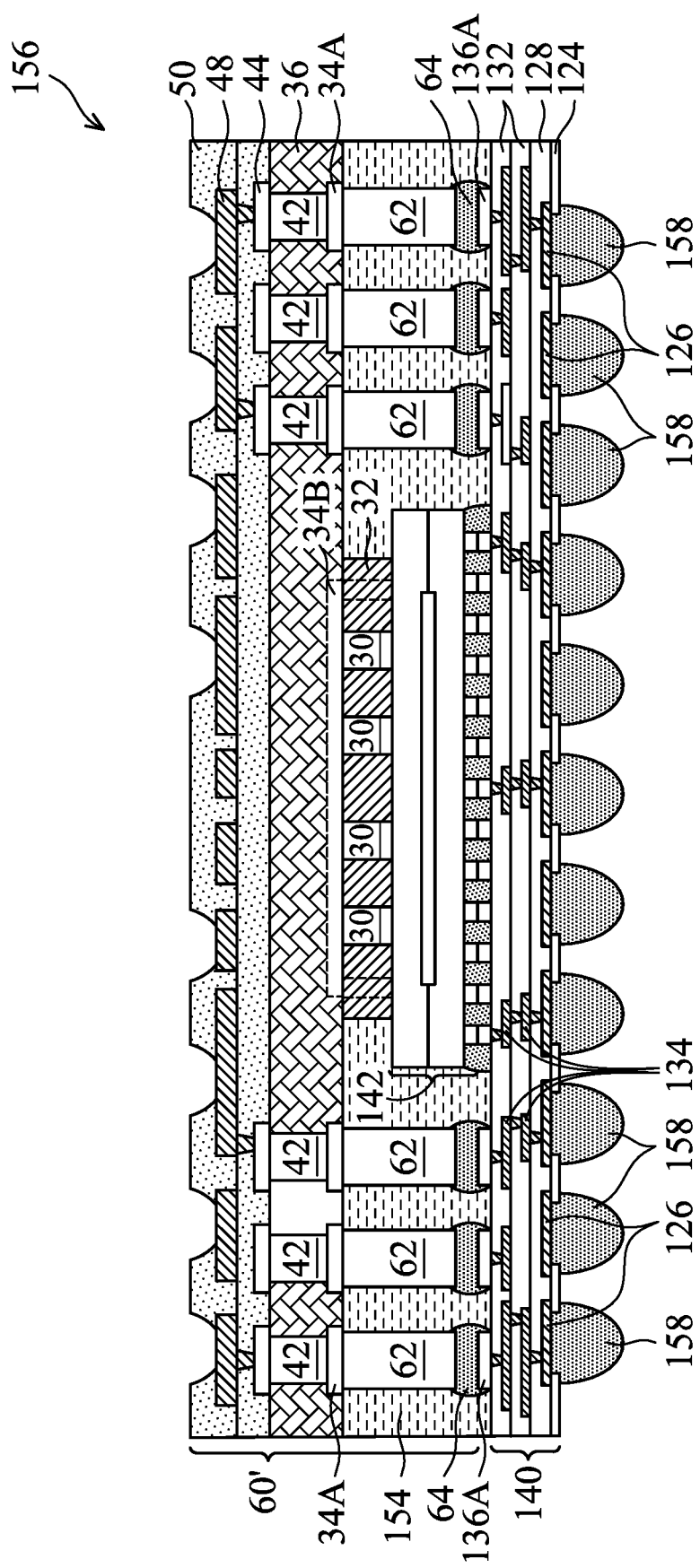

FIG. 18 illustrates the formation of electrical connectors 158. In accordance with some embodiments of the present disclosure, openings are formed in dielectric layer 124 to reveal the metal pads in RDLs 126, for example, through laser drilling or etching. Electrical connectors 158 are then formed. Electrical connectors 158 may include solder regions, metal pillars, metal pillars with solder layers thereon, or the like.

FIG. 19A illustrates the bonding of (top) package component 159 to package 156 through solder regions 160, thus forming a package 166. Package 166 is also referred to as a Package-on-Package (PoP) structure. The respective process is illustrated as process 416 in the process flow shown in FIG. 25. In accordance with some embodiments of the present disclosure, package 159 includes package substrate 161 and device die(s) 162, which may be memory dies such as Static Random Access Memory (SRAM) dies, Dynamic Random Access Memory (DRAM) dies, or the like. In accordance with some embodiments of the present disclosure, underfill 164 is disposed into the gap between package 159 and the underlying package 156, and is cured. In accordance with other embodiments of the present disclosure, no underfill is disposed into the gap between package 159 and the underlying package 156, and the gap remains to be unfilled. A singulation process may be performed to saw through package 156, which may be a composite wafer (reconstructed wafer), as a plurality of packages 156', with packages 159 bonded on packages 156'. Package 166 is thus formed, which includes package 156' bonded with package 159.

In accordance with some embodiments of the present disclosure, rigid layer 32 has width W2, and package component 142 has width W3. In accordance with some embodiments of the present disclosure, width W2 is smaller than width W3. Ratio W2/W3 may be in the range between about 0.5 and about 0.9 in accordance with some embodiments.

FIGS. 19B, 19C, 19D and 19E illustrate cross-sectional views of packages in accordance with some embodiments of the present disclosure. Unless specified otherwise, the materials and the formation methods of the components in these embodiments are essentially the same as the like components, which are denoted by like reference numerals in the embodiments shown in FIGS. 1 through 19A. The details regarding the formation processes and the materials of the components shown in FIGS. 19B, 19C, 19D and 19E may thus be found in the discussion of the embodiments shown in FIGS. 1 through 19A.

Figure 19B:
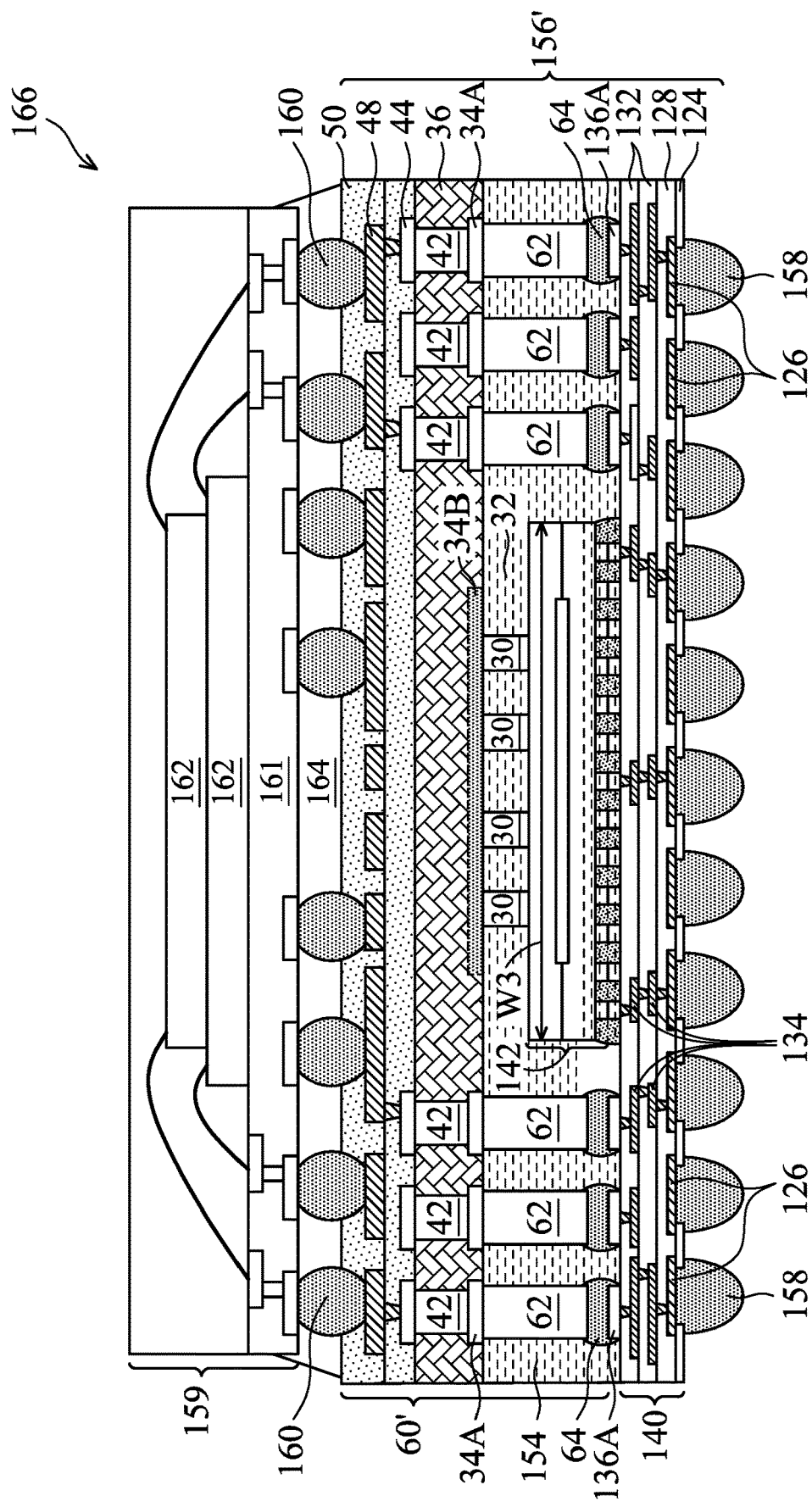
FIGS. 19B, 19C, 19D and 19E illustrate the cross-sectional views of packages in accordance with some embodiments.

FIG. 19B illustrates the cross-sectional view of package 166 in accordance with alternative embodiments. The package as shown in FIG. 19B is similar to the package shown in FIG. 19A, except the interposer 60' as shown in FIG. 11B is used (with solder regions 66 shown in FIG. 11B not formed). The processes for forming the package in FIG. 19B are essentially the same as shown in FIGS. 12 through 19A. Since the rigid layer 32 around metal spacers 30 is removed, encapsulant 154 will be filled to encircle and in contact with metal spacers 30.

Figure 19C:
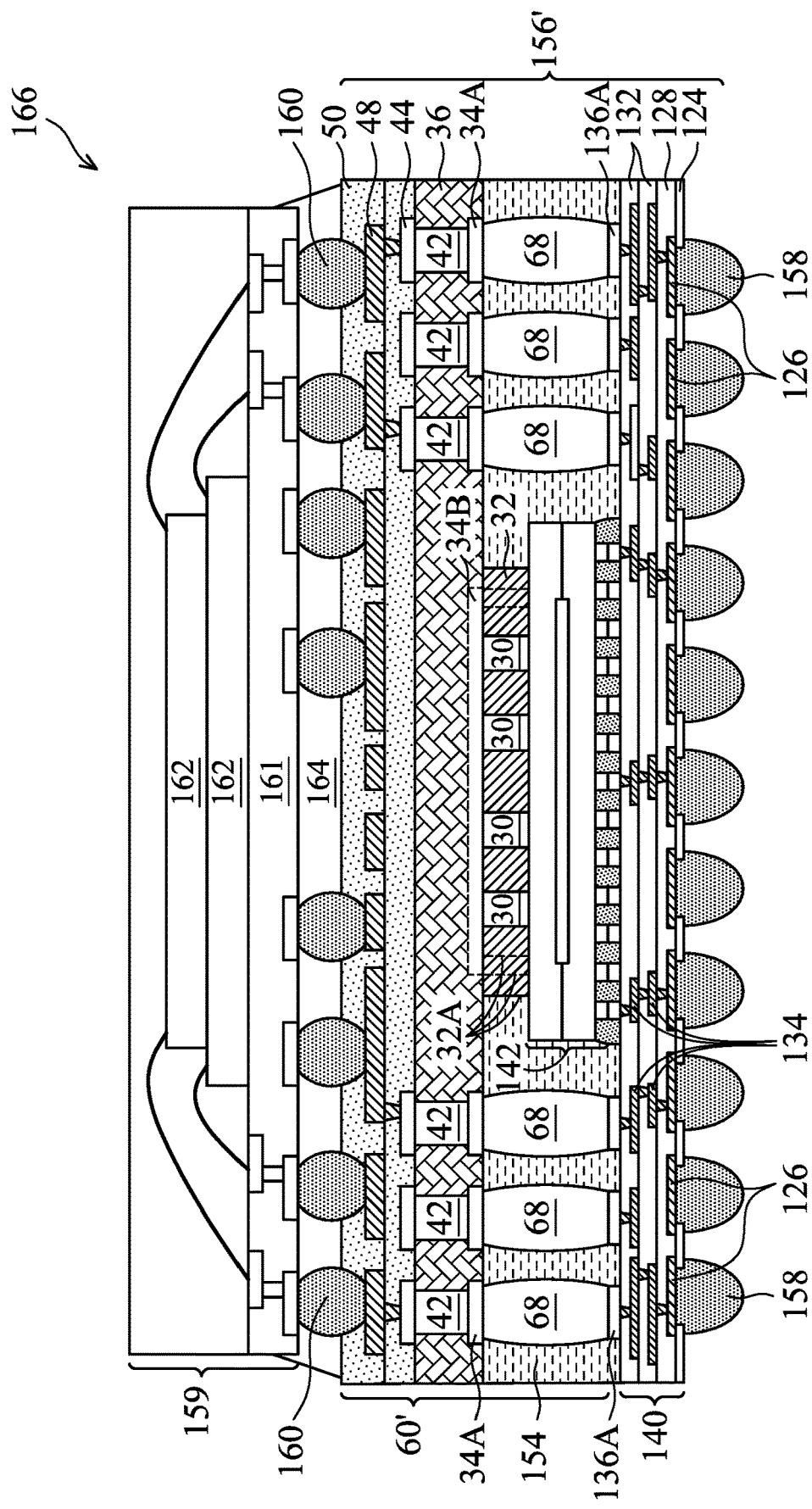

FIG. 19C illustrates the cross-sectional view of package 166 in accordance with yet alternative embodiments. The package as shown in FIG. 19C is similar to the package shown in FIG. 19A, except the interposer 60' as shown in FIG. 11C is used. The processes for forming the package in FIG. 19C is essentially the same as shown in FIGS. 12 through 19A (except the difference in interposers 60').

Figure 19D:
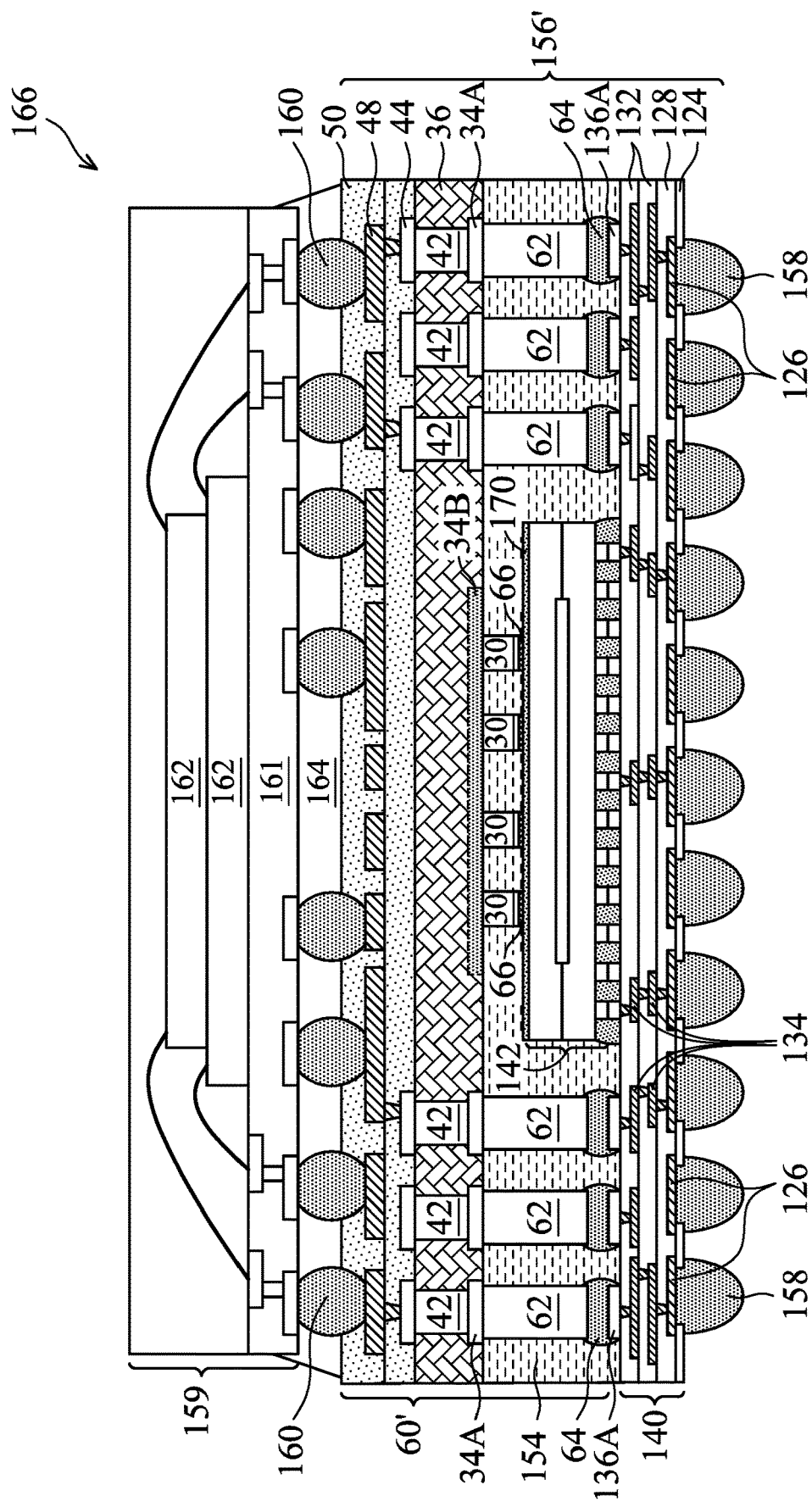
Figure 20:
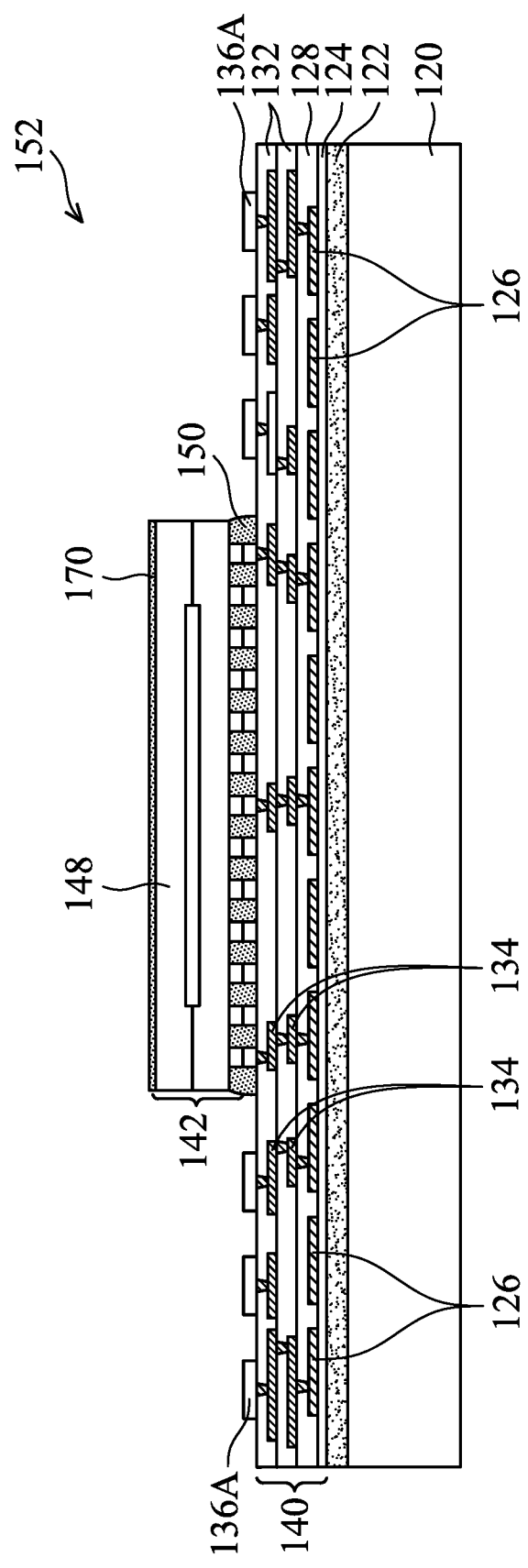
FIGS. 20 through 22 illustrate the cross-sectional views of intermediate stages in the formation of a package including an interposer and a fan-out package in accordance with some embodiments.
Figure 21:
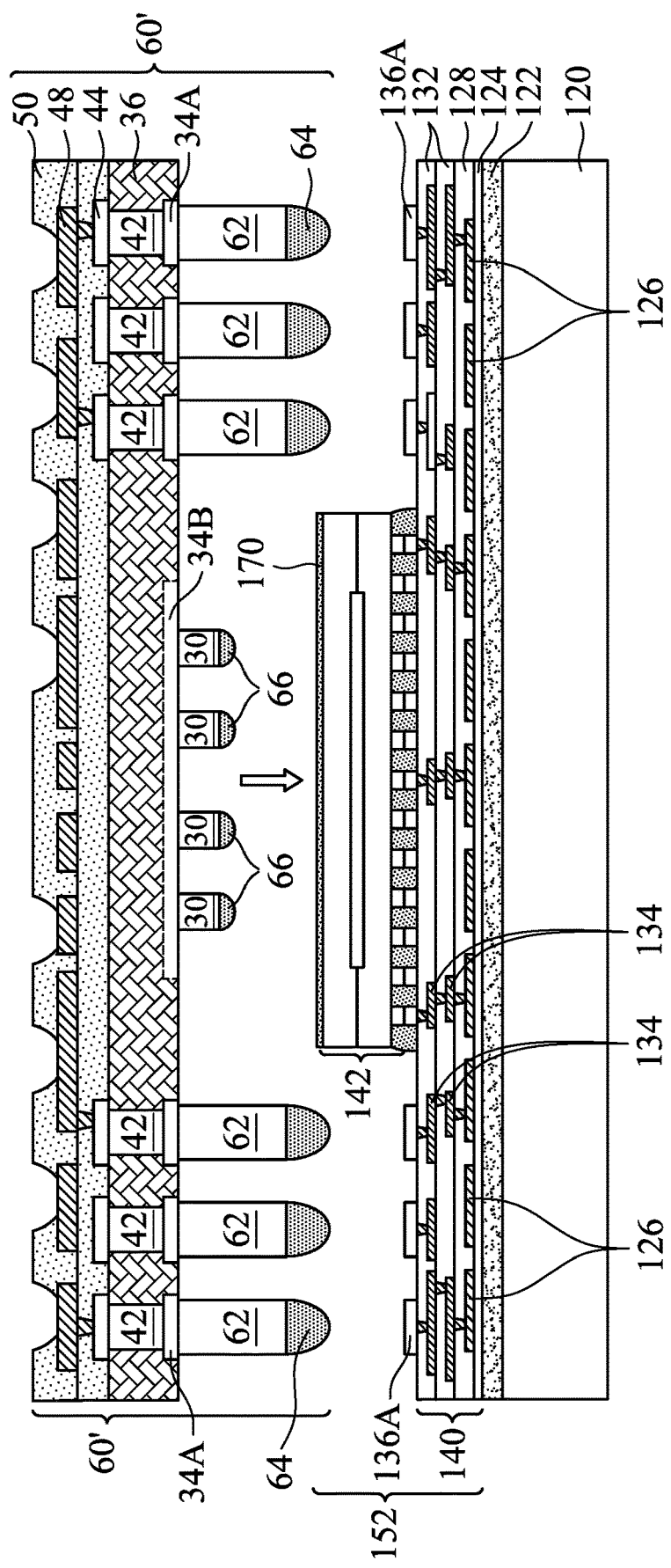
Figure 22:
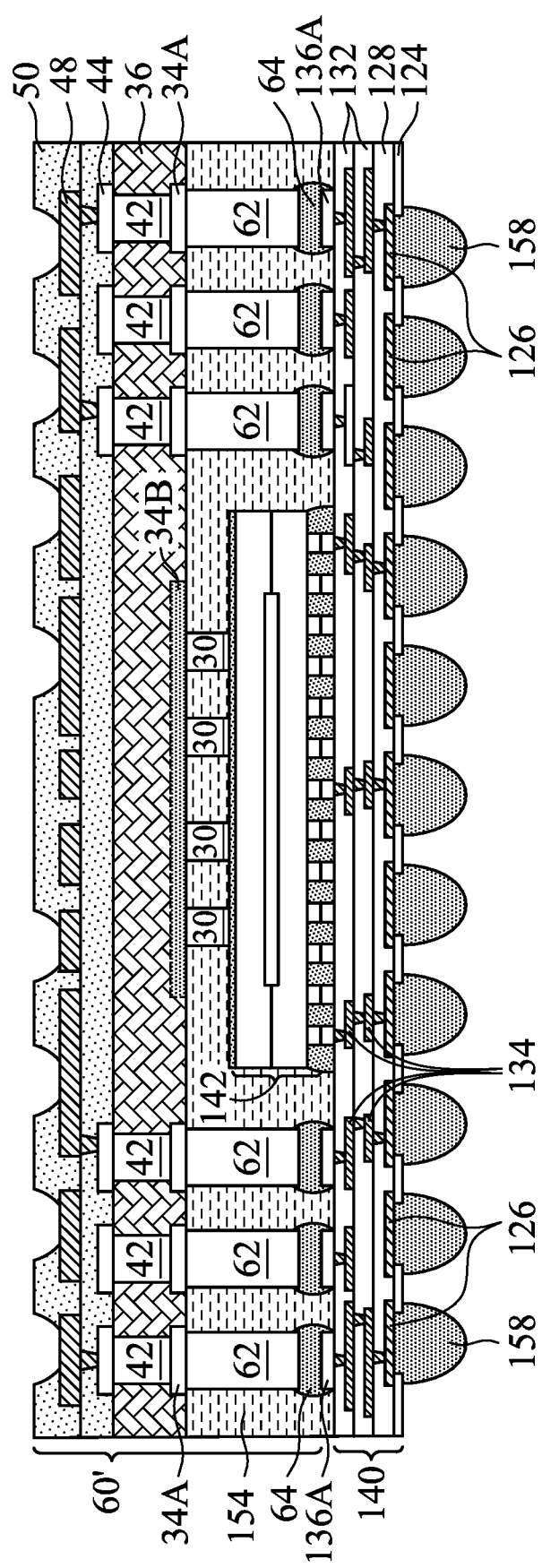

FIG. 19D illustrates the cross-sectional view of package 166 in accordance with yet alternative embodiments. The package as shown in FIG. 19D is similar to the package shown in FIG. 19A, except metal layer 170 is formed on the backside of package component 142, and solder regions 66 are formed to bond to metal layer 170. The cross-sectional views of some intermediate stages in the formation of the package 166 in FIG. 19D are shown in FIGS. 20 through 22, which are discussed in subsequently discussed processes.

Figure 19E:
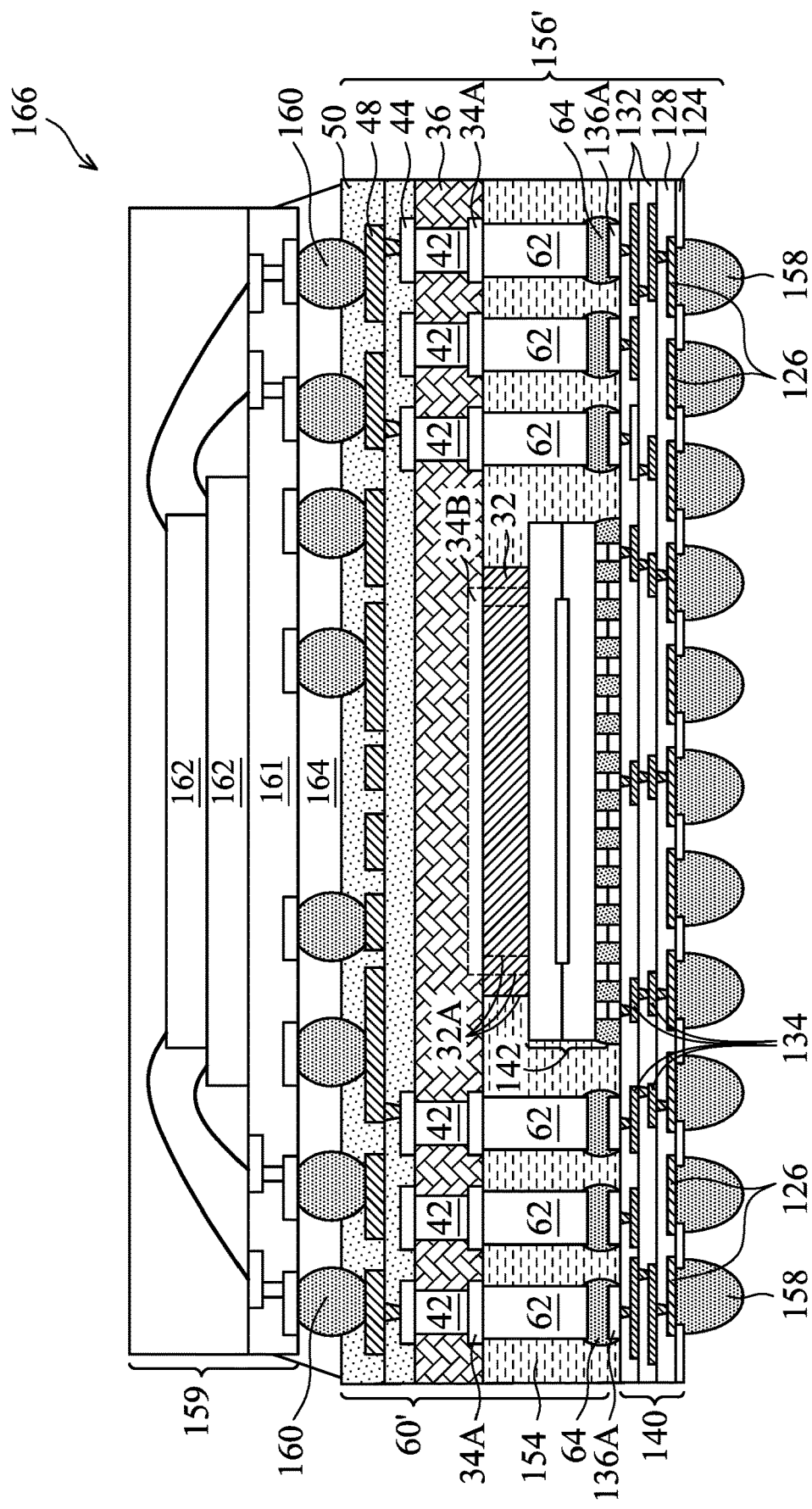

FIG. 19E illustrates the cross-sectional view of package 166 in accordance with yet alternative embodiments. The package as shown in FIG. 19E is similar to the package shown in FIG. 19A, except the interposer 60' as shown in FIG. 11D is used, with no metal spacers 30 being formed.

FIGS. 23A, 23B, 23C, and 23D illustrate the top views of metal spacers 30 in accordance with some embodiments. FIG. 23A illustrates that metal spacers 30 include a plurality of discrete pieces, which may have rectangular top-view shapes in accordance with some embodiments. The horizontal dimensions W1 may be in the range between about 20 µm and about 300 µm in accordance with some embodiments. Metal spacers 30 may be laid out uniformly, for example, with a repeatable pattern such as an array, a beehive pattern, or the like. The metal spacers 30 shown in FIG. 23B are similar to the metal spacers shown in FIG. 23A, except the top view shapes of metal spacers 30 are circular. FIG. 23C illustrates that metal spacers 30 are formed as a grid including horizontal strips and vertical strips joined together to form a grid. FIG. 23D illustrates that metal spacers 30 are formed as elongated and discrete strips. Forming metal spacers 30 as shown in FIGS. 23A, 23B, 23C, and 23D, rather than as a large solid metal plate may reduce the pattern loading effect in the plating process without compromising their function.

In FIGS. 19A, 19B, 19C, and 19D, metal spacers 30, metal plate 34B, and metal layer 170 (FIG. 19D) may be electrically connected to semiconductor substrate 148 in package component 142. In accordance with other embodiments, metal spacers 30, metal plates 34B, and metal layer 170 are used for thermal dissipation, and are not used for electrically connected to semiconductor substrate 148. The top ends of these features, however, are terminated either at the top surface and the sidewalls of metal plate 34B, or at the top surfaces of metal spacers 30 if metal plate 34B is not formed. Accordingly, metal spacers 30, metal plate 34B, and metal layer 170 (FIG. 19D) are configured not to allow currents to flow through. When an adhesive film (as will be discussed in subsequent paragraphs) is used between metal layer 170 and substrate 148, the adhesive film may be electrically conductive or electrically insulating. Accordingly, metal plate 34B and metal layer 170 may also be electrically floating when the adhesive film is electrically insulating.

FIGS. 20 through 22 illustrate the cross-sectional views of intermediate stages in the formation of the package as shown in FIG. 19D. Unless specified otherwise, the materials and the formation methods of the components in these embodiments are essentially the same as the like components, which are denoted by like reference numerals in the embodiments shown in FIGS. 12 through 19A.

Referring to FIG. 20, the initial steps of these embodiments are essentially the same as shown in FIGS. 12 through 14, except package component 142 includes metal layer 170 at its back surface (the illustrated top surface). The resulting package 152 is shown in FIG. 20. In accordance with some embodiments of the present disclosure, metal layer 170 is in physical contact with substrate 148, which may be a semiconductor substrate. In accordance with some embodiments of the present disclosure, metal layer 170 is attached to the back surface (the illustrated top surface) of substrate 148 through an adhesive film (not shown). Metal layer 170 may include a copper layer, a titanium layer, a composite Ti/Cu layer including a titanium layer and a copper layer over the titanium layer, a composite TiN/Cu layer, a composite Ti/Cu/Ti layer, a composite Al/Ti/Ni/Ag layer, or the like. Metal layer 170 is pre-formed as the top surface layer of package component 142 before package component 142 is bonded to interconnect structure 140. For example, metal layer 170 may be formed on package component 142 before package component 142 is sawed from the respective wafer. Accordingly, all edges of metal layer 170 may be flush with the respective edges of semiconductor substrate 148. Metal layer 170 may also be a blanket layer extending on the entire top surface of package component 142. Furthermore, metal layer 170 may be formed through metal foil lamination, deposition (such as using PVD or CVD), adhesion (such as through an adhesive film), or the like. Metal layer 170 may have a thickness in the range between about 0.3 μm and about 150 μm.

Next, referring to FIG. 21, interposer 60', which is shown in FIG. 11B, is aligned to package 152. Solder regions 64 are aligned to and placed on metal pads 136A. A reflow is then performed, so that solder regions 64 are reflowed to join metal pads 136A to metal pillars 62. In addition, solder regions 66 are reflowed to bond metal spacers 30 to metal layer 170. Solder regions 66 and metal spacers 30 may maintain the standoff distance, and also have the function of dissipating heat generated in package component 142 upwardly. Furthermore, through solder region 66, interposer 60' is prevented from warping both upwardly and downwardly, and the warpage in the resulting package is significantly reduced. In subsequent process steps, which are similar to what are shown in FIGS. 17, 18, and 19A, the package 166 as shown in FIG. 19D is formed.

In above-illustrated embodiments, some processes and features are discussed in accordance with some embodiments of the present disclosure. Other features and processes may also be included. For example, testing structures may be included to aid in the verification testing of the three-dimensional (3D) packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By forming the rigid layer and/or metal spacers, the standoff distance between the interposer and the package component underlying the interposer is defined to have the desirable value. The warpage of the resulting package is thus reduced.

In accordance with some embodiments of the present disclosure, a method includes forming an interposer comprising forming a rigid dielectric layer; and removing portions of the rigid dielectric layer; bonding a package component to an interconnect structure; bonding the interposer to the interconnect structure, wherein a spacer in the interposer has a bottom surface contacting a top surface of the package component, and the spacer comprises a feature selected from the group consisting of a metal feature, the rigid dielectric layer, and combinations thereof; and performing a die-saw on the interconnect structure. In an embodiment, the method further includes forming the interconnect structure on a carrier, with the package component bonded to the interconnect structure when the interconnect structure is located on the carrier. In an embodiment, the method further includes forming the metal feature, with the rigid dielectric layer being formed to embed the metal feature therein; and performing a planarization process to level a surface of the metal feature with a surface of the rigid dielectric layer. In an embodiment, in the removing the portions of the rigid dielectric layer, an entirety of the rigid dielectric layer is removed. In an embodiment, the method further includes forming a solder region on the metal feature and as a part of the interposer, wherein the solder region contacts the package component after the interposer is bonded to the interconnect structure. In an embodiment, in the removing the portions of the rigid dielectric layer, a first portion of the rigid dielectric layer is removed, and a second portion of the rigid dielectric layer is left un-removed. In an embodiment, the spacer comprises the metal feature and a solder region, the package component comprises a device die comprising a semiconductor substrate and a metal layer on the semiconductor substrate, and the solder region joins the metal feature to the metal layer.

In accordance with some embodiments of the present disclosure, a method includes forming an interposer, which includes plating a metal spacer over a first carrier; forming a dielectric layer to embed the metal spacer therein; forming a substrate over the dielectric layer; forming through-vias penetrating through the substrate; forming a first plurality of redistribution lines over and electrically coupling to the through-vias; removing the first carrier to reveal the dielectric layer; and patterning the dielectric layer to remove a first portion of the dielectric layer, wherein a second portion of the dielectric layer remains; forming an interconnect structure over a second carrier; bonding a package component to the interconnect structure; and bonding the interposer to the interconnect structure, wherein the metal spacer and the second portion of the dielectric layer space the package component from the substrate. In an embodiment, the forming the interposer further comprises forming a solder region on the metal spacer. In an embodiment, the package component comprises: a semiconductor substrate; and a blanket metal layer over the semiconductor substrate, wherein when the interposer is bonded to the interconnect structure, the solder region is simultaneously bonded to the blanket metal layer. In an embodiment, the method further includes forming a plurality of metal pads on the dielectric layer; and forming a plurality of metal pillars on the interposer, wherein the through-vias and the plurality of metal pillars are on opposite surfaces of the plurality of metal pads; and forming a plurality of solder regions, each on one of the plurality of metal pillars. In an embodiment, the method further includes forming a plurality of metal pads on the dielectric layer; and forming a plurality of solder regions on the interposer, wherein the through-vias and the plurality of solder regions are on opposite surfaces of the plurality of metal pads. In an embodiment, the forming the substrate comprises laminating a film. In an embodiment, the forming the dielectric layer to embed the metal spacer comprises: laminating a dielectric film on the metal spacer; and planarizing the metal spacer and the dielectric film.

In accordance with some embodiments of the present disclosure, a package includes an interconnect structure comprising bond pads; a package component over and bonded to the interconnect structure; an interposer over and bonded to the interconnect structure, the interposer comprising a metal feature overlapping the package component; a rigid dielectric layer encapsulating the metal feature therein; redistribution lines over the rigid dielectric layer; and electrical conductive features bonded to the interconnect structure, wherein the electrical conductive features are electrically coupled to the bond pads in the interconnect structure; and an encapsulant contacting sidewalls of the rigid dielectric layer and a top surface of the package component. In an embodiment, the package further includes a substrate over the rigid dielectric layer; and a metal plate over and contacting the metal feature and the rigid dielectric layer, wherein the metal plate is in the substrate, and has a bottom surface substantially coplanar with a bottom surface of the substrate. In an embodiment, the package component comprises a device die comprising a semiconductor substrate, wherein the metal feature and the rigid dielectric layer are in physical contact with a top surface of the semiconductor substrate. In an embodiment, the interposer further comprises: a substrate over and contacting the rigid dielectric layer; and through-vias in the substrate, wherein the redistribution lines electrically couple the redistribution lines to the electrical conductive features. In an embodiment, the rigid dielectric layer comprises an Ajinomoto Build-up Film (ABF). In an embodiment, the electrical conductive features comprise metal pillars, with bottom surfaces of the metal pillars extending below a top surface of the package component.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
 a conductive pillar having a first surface, a second surface, and a sidewall surface extending between the first surface and the second surface, the sidewall surface comprising:
  a first part; and
  a second part connected to the first part;
 a device die;
 a barrier layer in contact with the first part of the sidewall surface of the conductive pillar, wherein the barrier layer comprises a planar top surface comprising a first portion directly over and overlapping the device die, and a second portion vertically misaligned from the device die, and wherein the first part of the sidewall surface extends to the planar top surface of the barrier layer;
 an encapsulant in contact with the second part of the sidewall surface of the conductive pillar, wherein the device die is further in the encapsulant; and
 a reflowable conductive material on the first surface of the conductive pillar, wherein the reflowable conductive material is in the encapsulant.

2. The package of claim 1, wherein both of the barrier layer and the encapsulant are formed of dielectric materials.

3. The package of claim 1, wherein the barrier layer is over the encapsulant, and wherein the conductive pillar comprises a first portion in the barrier layer, and a second portion in the encapsulant, and wherein the first portion and the second portion have different widths.

4. The package of claim 3, wherein the first portion is narrower than the second portion.

5. The package of claim 1, wherein the first part and the second part of the sidewall surface extend in a vertical direction, and wherein the first part is vertically misaligned from the second part.

6. The package of claim 1, wherein the sidewall surface further comprises a third part in contact with the barrier layer, wherein the first part is vertically misaligned from the third part.

7. The package of claim 6 further comprising a horizontal surface connecting the first part of the sidewall surface to the third part of the sidewall surface.

8. The package of claim 1, wherein a portion of the encapsulant extends over the device die.

9. The package of claim 8, wherein the reflowable conductive material extends to a level lower than a top surface of the device die.

10. The package of claim 8 further comprising a redistribution structure comprising a plurality of redistribution lines therein, wherein both of the reflowable conductive material and the device die are over and bonded to the redistribution structure.

11. The package of claim 1, wherein an entirety of the first part of the sidewall surface is higher than the device die.

12. The package of claim 1, wherein a lower vertical portion of the sidewall surface of the conductive pillar is in physical contact with the encapsulant, and the encapsulant further continuously extends to, and is in physical contact with, the device die, and portions of the encapsulant in contact with the conductive pillar and the device die are formed of a same dielectric material.

13. A package comprising:
 a conductive pillar comprising:
  an upper portion having a first width;
  a lower portion underlying the upper portion, wherein the lower portion has a second width greater than the first width;
 a first dielectric layer encircling the upper portion of the conductive pillar;
 a second dielectric layer underlying the first dielectric layer, wherein the second dielectric layer contacts the lower portion of the conductive pillar;
 a device die in the second dielectric layer, wherein a portion of the second dielectric layer overlaps the device die;
 a solder region contacting a bottom end of the conductive pillar; and a metal feature contacting a semiconductor substrate of the device die to form a horizontal interface, wherein the metal feature comprises a metal layer extending from a first edge to a second edge of the semiconductor substrate, wherein the first edge and the second edge are opposing edges of the semiconductor substrate, and the package further comprises a metal spacer over and contacting the metal layer, with the metal spacer being narrower than the metal layer.

14. The package of claim 13, wherein the solder region is inside the second dielectric layer.

15. The package of claim 13, wherein the second dielectric layer comprises a molding compound.

16. A package comprising:
a device die comprising:
  a semiconductor substrate comprising a front surface and a back surface opposing the front surface;
  an integrated circuit device at the front surface; and
  a conductive pad on a front side of the device die;
a molding compound encircling the device die;
a dielectric layer over and contacting the molding compound, wherein the dielectric layer is vertically higher than the device die;
a conductive pillar comprising:
  a sidewall, wherein the sidewall comprises:
    an upper vertical portion;
    a lower vertical portion in the molding compound; and
    a middle vertical portion between the upper vertical portion and the lower vertical portion, wherein the middle vertical portion is vertically offset from the upper vertical portion and the lower vertical portion, wherein an entirety of the upper vertical portion and the middle vertical portion are in the dielectric layer, and are vertically higher than an entirety of the device die, and wherein both of the upper vertical portion and the middle vertical portion are in the dielectric layer;
  a top horizontal surface; and
  a bottom horizontal surface, wherein the sidewall connects the top horizontal surface to the bottom horizontal surface; and
a metal feature over and physically contacting the back surface of the semiconductor substrate of the device die to form a horizontal interface.

17. The package of claim 16, wherein a part of the conductive pillar having the middle vertical portion of the sidewall is wider than additional parts of the conductive pillar comprising the upper vertical portion and the lower vertical portion of the sidewall.

18. The package of claim 16, wherein a first top end of the upper vertical portion of the sidewall of the conductive pillar is coplanar with a top surface of the dielectric layer, and a first bottom end of a middle portion of the conductive pillar is coplanar with a second bottom surface of the dielectric layer.

19. The package of claim 16 further comprising a solder region in the molding compound and joined to the conductive pillar.

20. The package of claim 19, wherein the lower vertical portion of the sidewall of the conductive pillar comprises a bottommost end joining the solder region, and a topmost end coplanar with a top surface of the molding compound.

* * * * *